(12) United States Patent
Seo et al.

(10) Patent No.: US 11,937,454 B2
(45) Date of Patent: Mar. 19, 2024

(54) DISPLAY PANEL AND METHOD FOR MANUFACTURING THE SAME

(71) Applicant: Samsung Display Co., Ltd., Yongin-si (KR)

(72) Inventors: Junghan Seo, Hwaseong-si (KR); Woo Yong Sung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 439 days.

(21) Appl. No.: 17/255,726

(22) PCT Filed: Jun. 4, 2019

(86) PCT No.: PCT/KR2019/006691
§ 371 (c)(1),
(2) Date: Dec. 23, 2020

(87) PCT Pub. No.: WO2020/027418
PCT Pub. Date: Feb. 6, 2020

(65) Prior Publication Data
US 2021/0273026 A1 Sep. 2, 2021

(30) Foreign Application Priority Data

Jul. 31, 2018 (KR) .......................... 10-2018-0089154

(51) Int. Cl.
*H10K 59/121* (2023.01)
*H10K 50/844* (2023.01)
(Continued)

(52) U.S. Cl.
CPC ......... *H10K 59/121* (2023.02); *H10K 50/844* (2023.02); *H10K 59/65* (2023.02);
(Continued)

(58) Field of Classification Search
None
See application file for complete search history.

(56) References Cited

U.S. PATENT DOCUMENTS

| 9,632,487 B2 | 4/2017 | Kim et al. |
| 9,634,287 B1 | 4/2017 | Shin |

(Continued)

FOREIGN PATENT DOCUMENTS

| CN | 106887523 A | 6/2017 |
| CN | 107275363 A | 10/2017 |

(Continued)

OTHER PUBLICATIONS

International Search Report for corresponding International Application No. PCT/KR2019/006691, dated Sep. 11, 2019, 5pp.

*Primary Examiner* — Michael Lebentritt
(74) *Attorney, Agent, or Firm* — Lewis Roca Rothgerber Christie LLP

(57) ABSTRACT

A display panel according to an embodiment of the present invention includes an interlayer insulating layer, a pixel layer including a lower insulating layer between the interlayer insulating layer and a base substrate, an encapsulation layer including a first inorganic layer, and a first blocking groove in the display area, adjacent to a module hole, passing through the interlayer insulating layer to expose a portion of a top surface of the lower insulating layer, and the first blocking groove is surrounded by the first inorganic layer to contact the first inorganic layer.

20 Claims, 25 Drawing Sheets

(51) Int. Cl.
  *H10K 59/65* (2023.01)
  *H10K 71/00* (2023.01)
  *H10K 77/10* (2023.01)
  *H10K 59/12* (2023.01)

(52) U.S. Cl.
  CPC ............. *H10K 71/00* (2023.02); *H10K 77/10* (2023.02); *H10K 59/1201* (2023.02)

(56) References Cited

U.S. PATENT DOCUMENTS

| | | | |
|---|---|---|---|
| 9,825,103 | B2 | 11/2017 | Rappoport et al. |
| 9,905,629 | B2 | 2/2018 | Kim et al. |
| 9,966,566 | B2 | 5/2018 | Shin |
| 10,186,191 | B2 | 1/2019 | Kang et al. |
| 10,199,448 | B2 | 2/2019 | Kim et al. |
| 10,224,506 | B2 | 3/2019 | Shin |
| 10,332,947 | B2 | 6/2019 | Kim et al. |
| 10,553,819 | B2 | 2/2020 | Kim et al. |
| 10,615,369 | B2 | 4/2020 | Choi et al. |
| 2016/0284782 | A1* | 9/2016 | Seo ................... H01L 27/1255 |
| 2017/0026553 | A1 | 1/2017 | Lee et al. |
| 2017/0141352 | A1 | 5/2017 | Shin |
| 2017/0148856 | A1 | 5/2017 | Choi et al. |
| 2017/0162111 | A1 | 6/2017 | Kang et al. |
| 2017/0207418 | A1 | 7/2017 | Shin |
| 2018/0159075 | A1 | 6/2018 | Kim et al. |
| 2018/0183004 | A1 | 6/2018 | Shin |
| 2019/0122608 | A1 | 4/2019 | Kang et al. |
| 2019/0334120 | A1 | 10/2019 | Seo et al. |
| 2022/0293886 | A1* | 9/2022 | Seon ................... H10K 50/844 |
| 2024/0023365 | A1 | 1/2024 | Choi et al. |

FOREIGN PATENT DOCUMENTS

| | | | | |
|---|---|---|---|---|
| CN | 108074486 A | * | 5/2018 | ....... G02F 1/133305 |
| KR | 10-2017-0015632 A | | 2/2017 | |
| KR | 10-2017-0057911 A | | 5/2017 | |
| KR | 10-2017-0059864 A | | 5/2017 | |
| KR | 10-2017-0065059 A | | 6/2017 | |
| KR | 10-2017-0115177 A | | 10/2017 | |
| KR | 10-2018-0002126 A | | 1/2018 | |
| KR | 10-2018-0026599 A | | 3/2018 | |
| KR | 10-2018-0063962 A | | 6/2018 | |
| KR | 10-2019-0094269 A | | 8/2019 | |
| KR | 10-2019-0126016 A | | 11/2019 | |
| KR | 10-2083646 B1 | | 3/2020 | |
| KR | 20230020039 A | * | 2/2023 | |

* cited by examiner

DISPLAY PANEL AND METHOD FOR MANUFACTURING THE SAME

CROSS-REFERENCE TO RELATED APPLICATIONS

This application is a U.S. National Phase Patent Application of International Application Number PCT/KR2019/006691, filed on Jun. 4, 2019, which claims priority to and the benefit of Korean Patent Application No. 10-2018-0089154, filed on Jul. 31, 2018, the entire content of each of which is incorporated herein by reference.

BACKGROUND

1. Field

The present invention relates to a display panel and a method for manufacturing the same, and more particularly, to a display panel having improved reliability and a method for manufacturing the same.

2. Description of Related Art

Display panels are activated according to an electrical signal to display an image. In the display panels, an organic light emitting display panel including an organic light emitting element has low power consumption, high luminance, and a high response speed.

An organic light emitting display panel includes an organic light emitting element. The organic light emitting element may be vulnerable to moisture or oxygen and thus may be easily damaged. Thus, in the organic light emitting display panel, as the moisture or oxygen introduced from the outside are stably blocked, the organic light emitting display device may be improved in reliability and lifetime.

SUMMARY

An object of the present invention is to provide a display panel, in which strength against an external impact is enhanced, and contamination such as external oxygen and moisture is prevented from being introduced, and a method for manufacturing the display panel.

A display panel according to an embodiment of the present invention includes a base substrate that is divided into a display area and a peripheral area adjacent to the display area in a plan view, a thin element layer including a thin film transistor disposed on the base substrate, an interlayer insulating layer covering the thin film transistor, and a lower insulating layer disposed between the interlayer insulating layer and the base substrate, an organic light emitting element disposed on the display area and connected to the thin film transistor, an encapsulation layer disposed on the thin element layer and including a first inorganic layer, a second inorganic layer disposed on the first inorganic layer, and an organic layer disposed between the first inorganic layer and the second inorganic layer, a module hole defined in the display area and penetrating from a rear surface of the base substrate to a top surface of the encapsulation layer, and a first blocking defined in the display area adjacent to the module hole and penetrating through the interlayer insulating layer to expose a portion of a top surface of the lower insulating layer.

The thin film transistor may include a semiconductor pattern disposed on the base substrate, a control electrode spaced apart from the semiconductor pattern and overlapping the semiconductor pattern in the plan view, and input and output electrodes which are spaced apart from each other and each of which is connected to the semiconductor pattern, wherein the lower insulating layer includes a first insulating layer disposed between the control electrode and the semiconductor pattern and a second insulating layer configured to the first insulating layer and the interlayer insulating layer, and a top surface of the second insulating layer provides a top surface of the lower insulating layer.

The first blocking groove may have an under-cut shape, and an inner surface of the first blocking groove may be covered by the first inorganic layer.

The pixel layer may further include a pattern electrode disposed between the interlayer insulating layer and the first inorganic layer to at least partially overlap a penetrated portion of the interlayer insulating layer in the plan view, wherein the pattern electrode may contact the first inorganic layer.

The blocking groove may be a closed shape surrounding the module hole in the plan view.

The display panel may further include a second blocking groove spaced apart from the first blocking groove so as to be defined between the first blocking groove and the organic light emitting element in the plan view, the second blocking groove being configured to pass through the interlayer insulating layer so as to expose a portion of a top surface of the lower insulating layer, wherein an inner surface of the second blocking groove may be covered by the first inorganic layer, and the organic layer may cover the first inorganic layer.

The display panel may further include a third blocking groove spaced apart from the first blocking groove so as to be defined between the module hole and the first blocking groove in the plan view, the third blocking groove being configured to pass through the interlayer insulating layer so as to expose a portion of a top surface of the lower insulating layer, wherein an inner surface of the third blocking groove may be covered by the first inorganic layer, and the second inorganic layer may cover the first inorganic layer.

The display panel may further include a filling member which is disposed inside the first blocking groove surrounded by the first inorganic layer and includes an organic material.

The second inorganic layer may cover the filling member and the first inorganic layer.

The base substrate may include at least one of glass, plastic, or a metal.

a base substrate that is divided into a display area and a peripheral area adjacent to the display area in a plan view;

an organic light emitting element disposed on the display area and including a first electrode, a second electrode disposed on the first electrode, and an emission layer disposed between the first electrode and the second electrode;

An electronic apparatus according to an embodiment of the present invention includes: a thin element layer including a thin film transistor connected to the organic light emitting element, an interlayer insulating layer on which the first electrode is disposed and which is disposed between the thin film transistor and the organic light emitting element, a lower insulating layer disposed between the base substrate and the interlayer insulating layer, and a pattern electrode disposed on the interlayer insulating layer; an encapsulation layer disposed on the thin element layer and including a first inorganic layer, a second inorganic layer disposed on the first inorganic layer, and an organic layer disposed between the first inorganic layer and the second inorganic layer; a module hole defined in the display area and penetrating from a rear surface of the base substrate to a top surface of the encapsulation layer; a blocking groove disposed in the display area and defined by a pattern part adjacent to the module hole and an opening configured to overlap the exposed pattern part and defined by the pattern electrode; and an electronic module configured to overlap the module hole, wherein the pattern part passes through the interlayer insulating layer to expose a portion of a top surface of the lower insulating layer.

The pattern electrode may be disposed on the same layer as the first electrode and includes the same material as the first electrode.

The opening may have a width less than a width of the pattern part in a cross-section.

The pattern electrode may be disposed to pass through the interlayer insulating layer so as to cover at least a portion of the pattern part, and the opening may be defined to pass through the pattern electrode and have a planar area less than a planar area of the pattern part.

An inner surface of the module hole may be defined as: an end of the penetrated base substrate; and an end of each of the lower insulating layer, the first inorganic layer, and the second inorganic layer, which are aligned with the end of the base substrate.

The pattern electrode and a portion of the top surface of the lower insulating layer may contact the first inorganic layer.

The blocking groove may be a closed shape surrounding the module hole in the plan view.

The electronic module may include at least one of an audio output module, a light emitting module, a light receiving module, or a camera module.

A method for manufacturing a display panel according to an embodiment of the present invention includes: forming a thin element layer including a pixel including a plurality of insulating layers on the display area of a base substrate that is divided into the display area including a hole area and a peripheral area adjacent to the display area; removing a portion of one of the insulating layers overlapping the hole area to form a blocking groove; depositing a first inorganic layer to the thin element layer and an inner surface of the blocking groove; applying an organic material on the first inorganic layer to form a preliminary organic layer so as to fill the blocking groove and cover the thin element layer; removing portions of the preliminary organic layer, which overlap the display area and a blocking area, to form an organic layer and a pattern part, respectively; forming a second inorganic layer which covers the organic layer and the filling member; and passing through the base substrate to form a module hole in an area surrounded by the blocking groove.

The thin element layer may include a thin film transistor and an organic light emitting element connected to the thin film transistor, and the blocking groove may be formed by removing a portion of the insulating layer disposed between the organic light emitting element and the thin film transistor.

According to the present invention, the display panel that does not interfere with the electronic module may be provided. Thus, even though the electronic module is provided, the display device having the narrow bezel area may be provided.

Also, the element may be easily prevented from being damaged by the moisture or oxygen introduced from the outside. Thus, the display device having improved reliability in process and use may be provided.

BRIEF DESCRIPTION OF THE DRAWINGS

FIG. 2b is an enlarged view of an area XX' of FIG. 2a.

FIG. 4a is a cross-sectional view taken along line I-I' of FIG. 2a.

FIG. 4b is a cross-sectional view illustrating a configuration in which a touch sensing unit is added to components of FIG. 4a.

FIGS. 5a and 5b are enlarged cross-sectional views of a hole area of FIG. 4a.

FIG. 9b is an enlarged plan view of one area of FIG. 9a.

DETAILED DESCRIPTION

Figure 1:
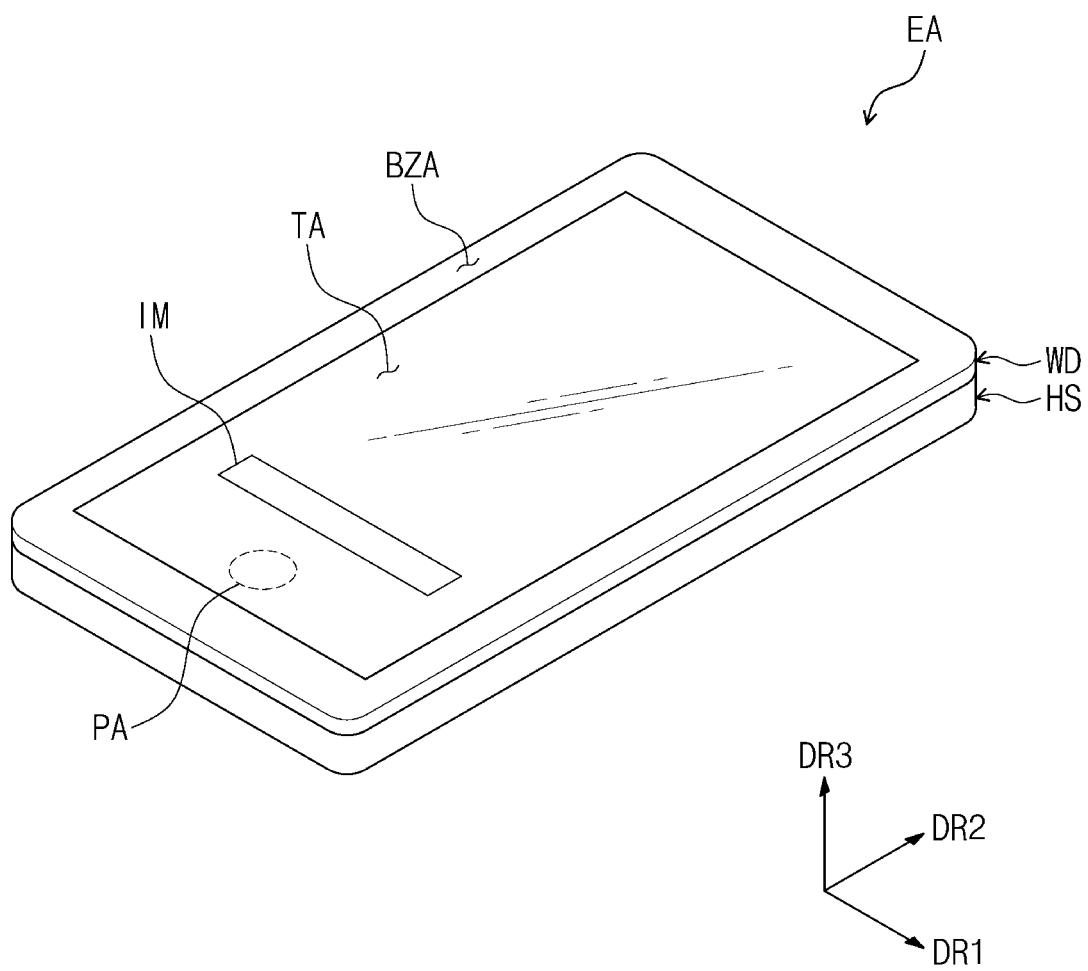
FIG. 1 is a perspective view of an electronic apparatus according to an embodiment of the present invention.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Throughout the disclosure, like reference numerals refer to like elements throughout this disclosure. In the drawings, a portion of the components is exaggerated or minimized in scale to clearly express various layers and areas.

Figure 2A:
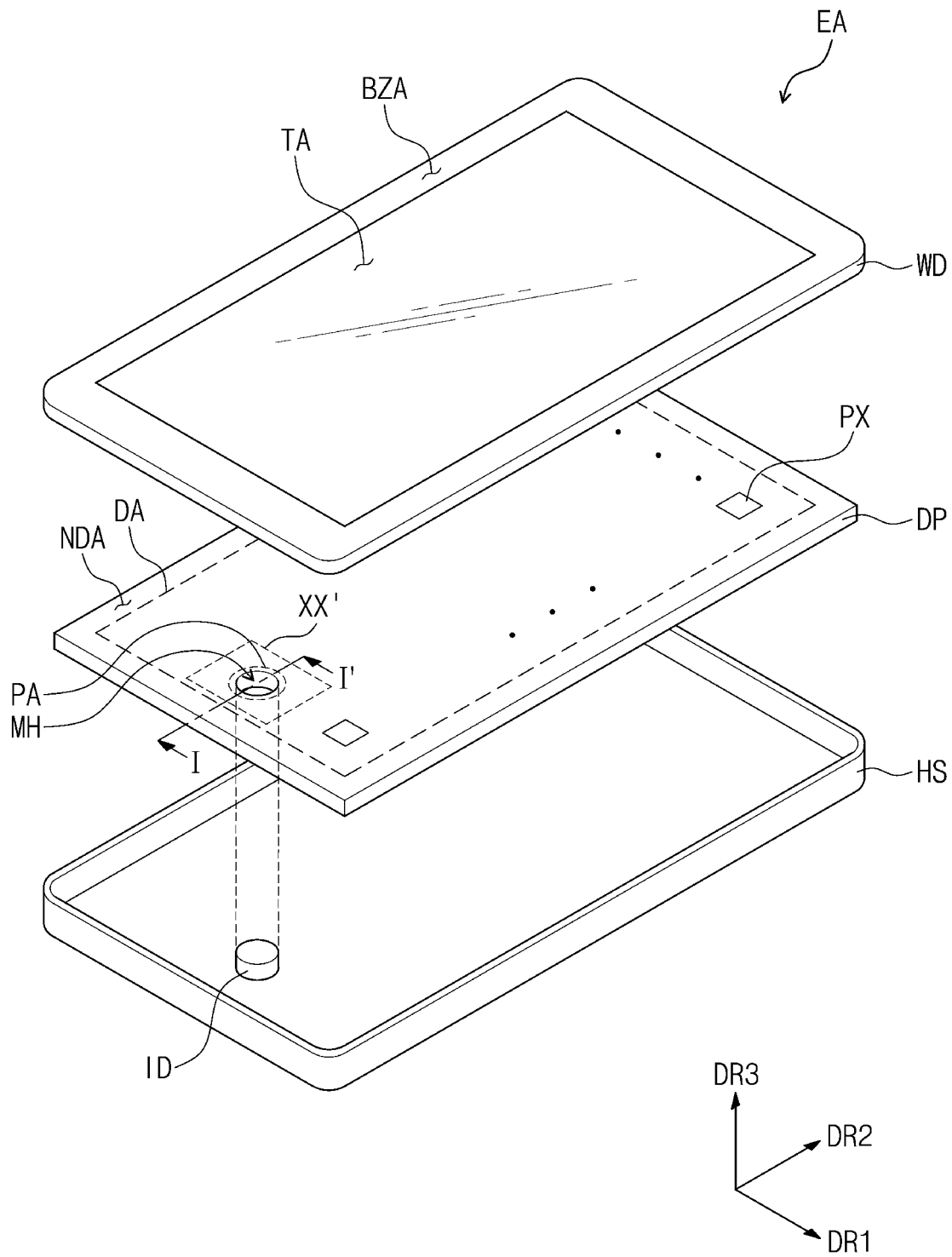
FIG. 2a is an exploded perspective view of the electronic apparatus of FIG. 1.
Figure 2B:
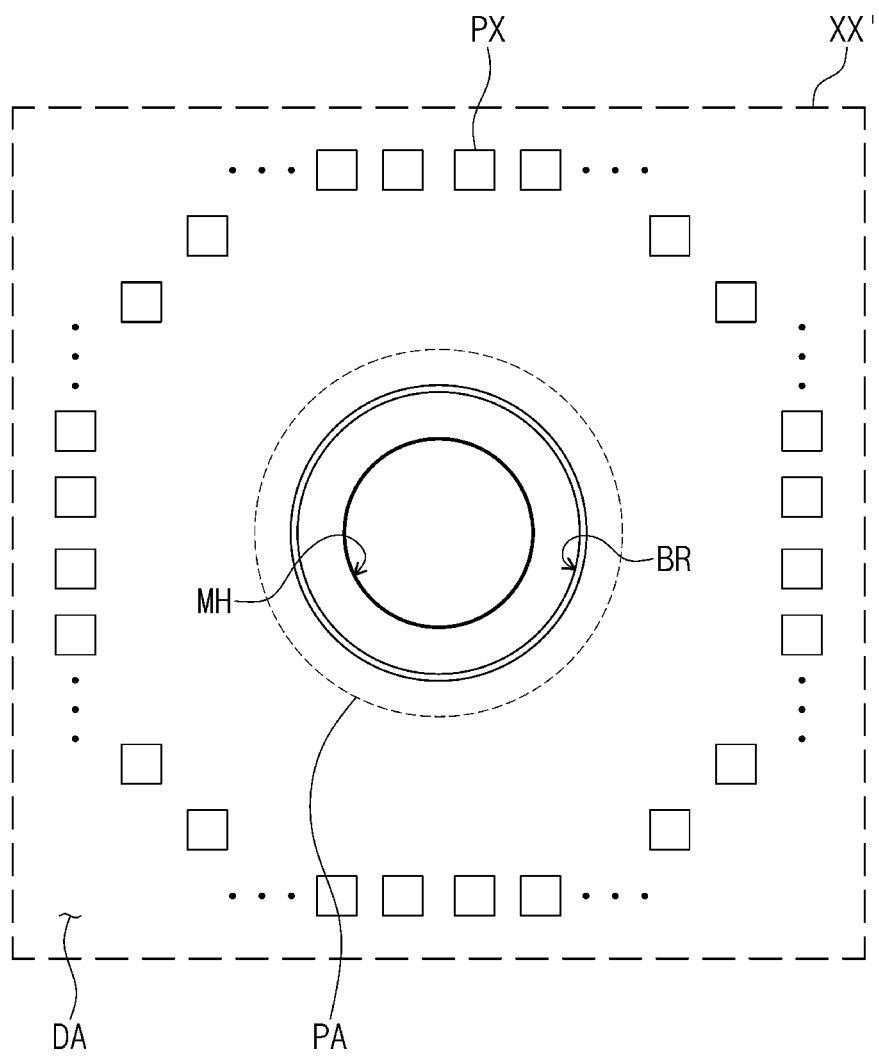
Figure 3:
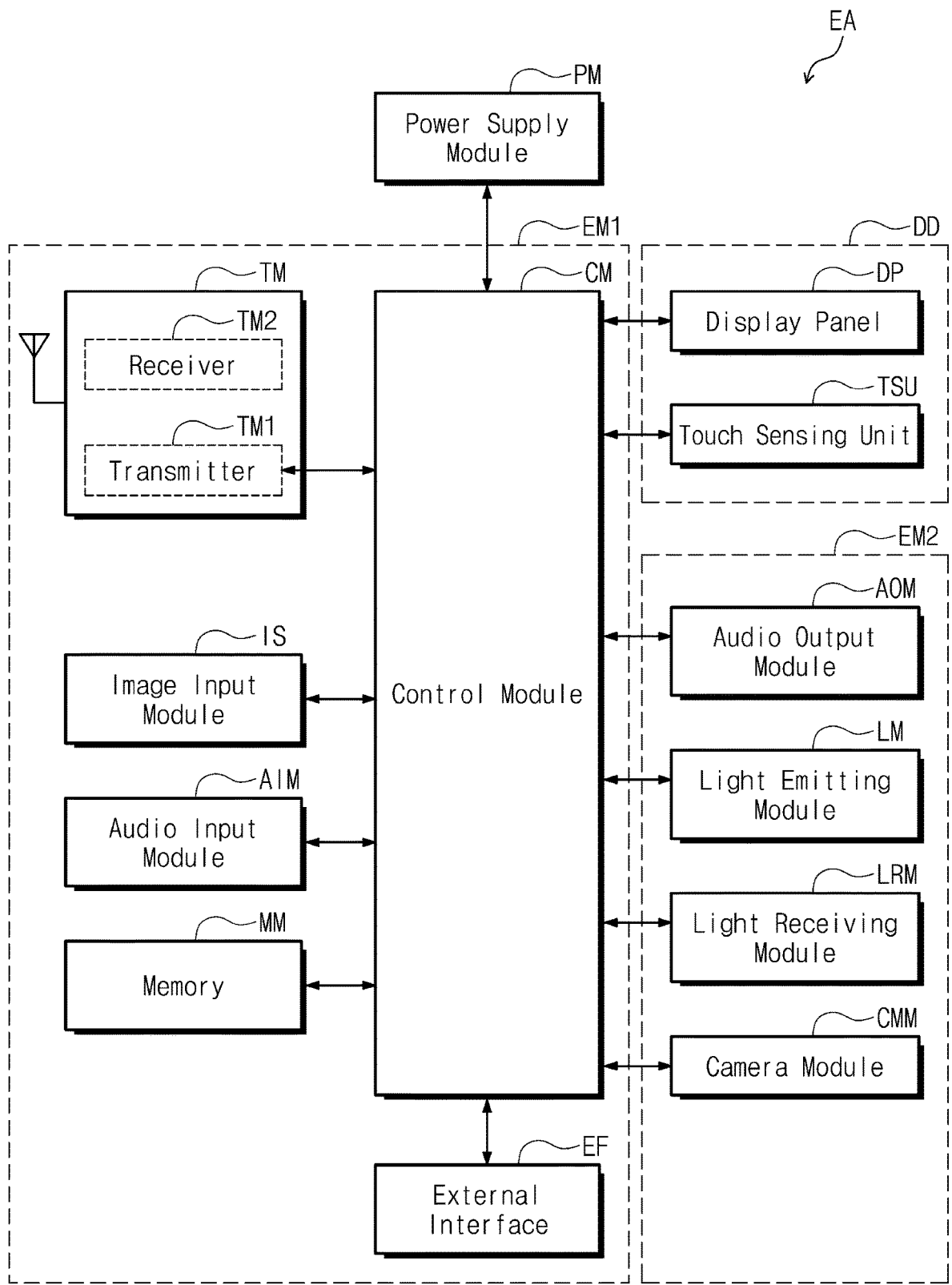
FIG. 3 is a block diagram of the electronic apparatus of FIG. 1.
Figure 4A:
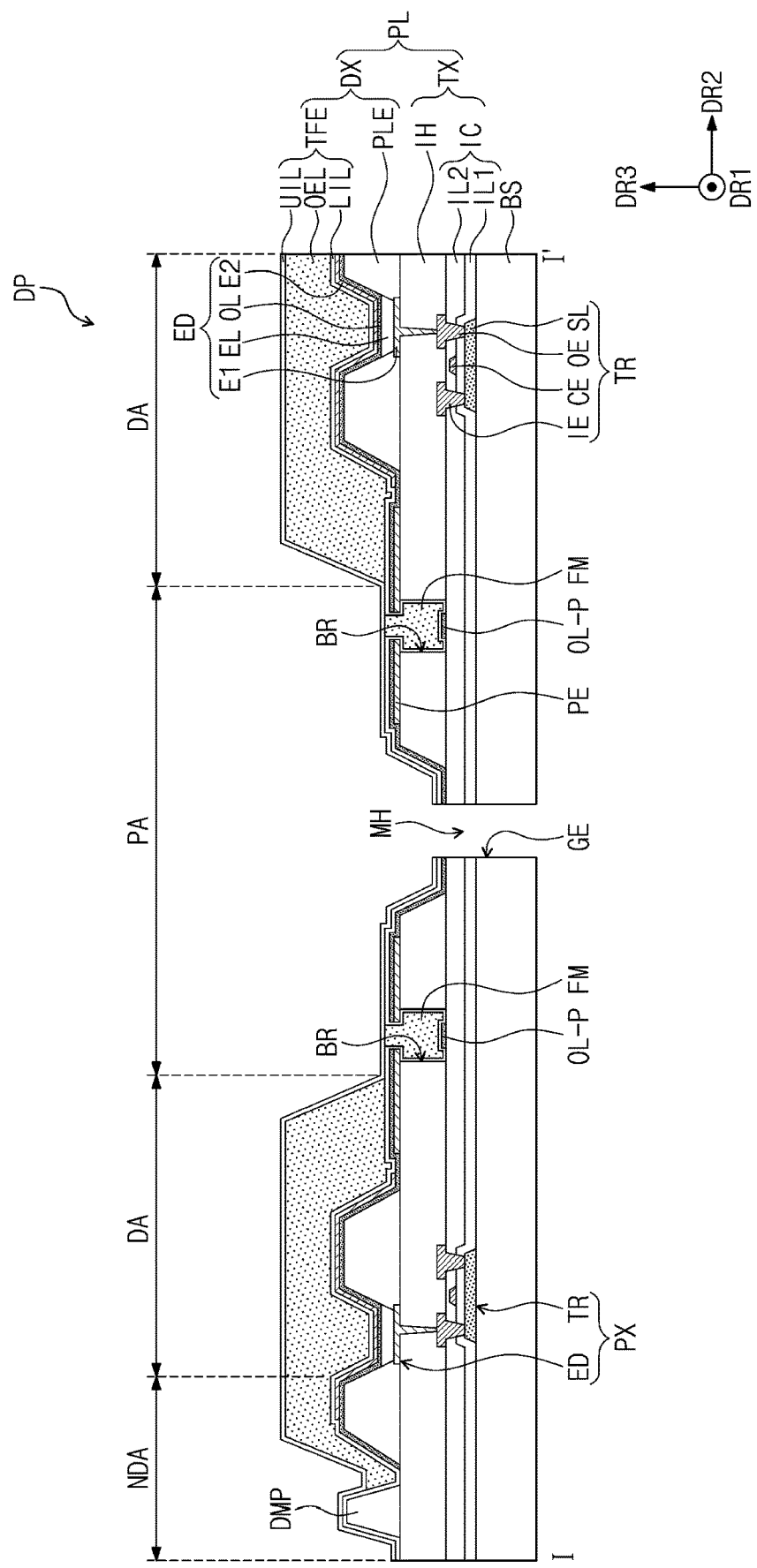
Figure 4B:
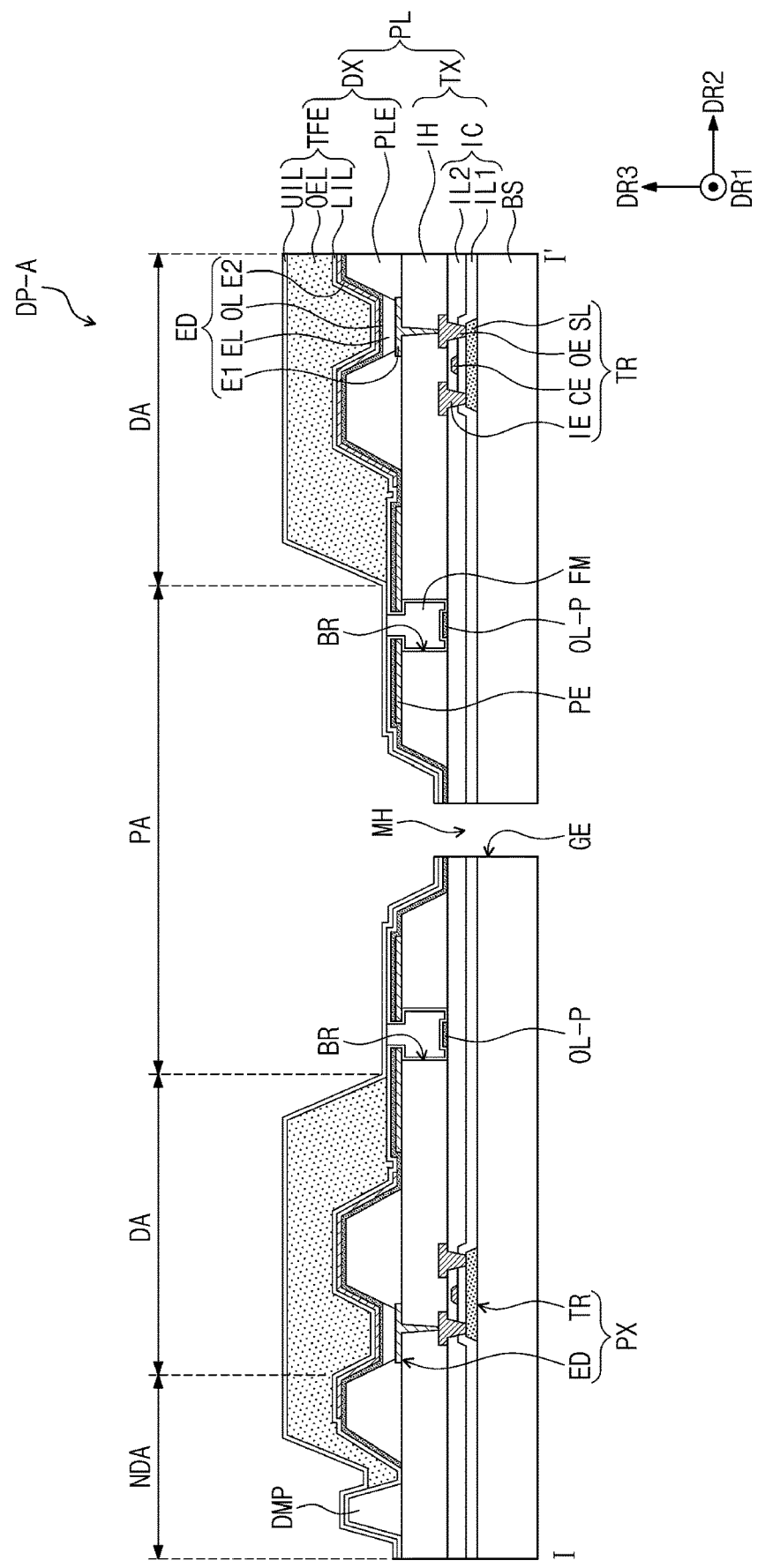

FIG. 1 is a perspective view of an electronic apparatus according to an embodiment of the present invention. FIG. 2a is an exploded perspective view of the electronic apparatus of FIG. 1. FIG. 2b is an enlarged view of an area XX' of FIG. 2a. FIG. 3 is a block diagram of the electronic apparatus of FIG. 1. FIG. 4a is a cross-sectional view taken along line I-I' of FIG. 2a. FIG. 4b is a cross-sectional view illustrating a configuration in which a touch sensing unit is added to components of FIG. 4a. Hereinafter, an electronic apparatus according to an embodiment of the present invention will be described with reference to FIGS. 1 to 4b.

As illustrated in FIGS. 1 to 3, an electronic apparatus EA may provide a display surface that displays an image IM on a front surface thereof. The display surface may be defined in parallel to a surface defined by a first direction DR1 and a second direction DR2. The display surface may include a transmission area TA and a bezel area BZA adjacent to the transmission area TA.

The electronic apparatus EA displays the image IM through the transmission area TA. FIG. 1A illustrates an Internet search window as an example of the image IM. The transmission area TA may have a rectangular shape that is parallel to the first direction DR1 and the second direction DR2. However, this is merely an example. For example, the display area DA may have various shapes and is not limited to any one embodiment.

A normal direction of the display surface may correspond to a thickness direction (hereinafter, referred to as a third direction) of the electronic apparatus EA. In this embodiment, a front surface (or a top surface) or a rear surface (or a bottom surface) of each of the components may be defined with respect to a direction in which the image IM is displayed. The front and rear surfaces may face each other in the third direction DR3.

The directions indicated as the first to third direction DR1, DR2, and DR3 may be a relative concept and thus changed into different directions. Hereinafter, the first to third directions may be directions indicated by the first to third directions DR1, DR2, and DR3 and designated by the same reference numerals, respectively.

The electronic apparatus EA includes a display panel DP, the window member WD, an electronic module ID, and a housing member HS. As illustrated in FIG. 3, the electronic apparatus EA may further include a display module DD, a first electronic module EM1, a second electronic module EM2, and a power supply module PM. In FIG. 2a, portions of the components of FIG. 3 are omitted.

The display module DD may include a display panel DP and a touch sensing unit TSU. The display panel DP generates the image IM. The touch sensing unit TSU may sense a user's input applied from the outside. The user's input includes various types of external inputs such as a portion of user's body, light, heat, a pressure, or the like. The touch sensing unit TSU according to an embodiment of the present invention may be provided directly on the display panel. In this case, the touch sensing unit TSU may be formed and provided on the display panel DP by a continuous process. In FIG. 2a, the touch sensing unit TSU is illustrated to be omitted.

The display panel DP may be divided into a hole area PA, a display area DA, and a peripheral area NDA. The display area DA may be an area on which the image IM is generated. A plurality of pixels PX generating the image IM may be located on the display area DA. This will be described later in detail. The peripheral area NDA is adjacent to the display area DA. The peripheral area NDA may surround the display area DA. A driving circuit or a driving line for driving the display area DA may be located on the peripheral area NDA.

Although not shown, a portion of the peripheral area NDA of the display panel DP may be curved. Thus, one portion of the peripheral area NDA may face the front surface of the electronic apparatus EA, and the other portion of the peripheral area NDA may face the rear surface of the electronic apparatus EA. Alternatively, in the display panel DP according to an embodiment of the present invention, the peripheral area NDA may be omitted.

Referring to FIG. 2b, the hole area PA may be an area in which a module hole MH and a blocking groove BR surrounding the module hole MH are defined. The display panel DP according to an embodiment may include at least one module hole MH. The hole area PA may be surrounded by the display area DA. According to an embodiment, the hole area PA may be defined in a circular shape surrounding the blocking groove BR.

The blocking groove BR, the module hole MH, and the filling member FM may be located in the hole area PA. The blocking groove BR, the module hole MH, and the filling member FM according to an embodiment of the present invention may be formed inside the display area DA on which an image is displayed.

The blocking groove BR surrounds the module hole MH. The blocking groove BR may have a closed curve shape.

In this embodiment, the blocking groove BR is illustrated as having a circular shape as an example. This is merely an example. For example, the blocking groove BR may have a shape in which a plurality of partially disconnected line patterns are arranged to surround the module hole MH. In FIG. 2B, the filling member FM and an additional pattern part OL-P located inside the blocking groove BR are omitted for convenience of description.

Although not shown, a plurality of signal lines passing through the blocking groove BR may be connected to pixels PX spaced apart from each other with the blocking groove BR therebetween. Thus, the pixels PX spaced apart from each other with the blocking groove BR therebetween may be connected to the corresponding signal lines and controlled by the same signal. The pixels PX may not be located in the module hole MH.

According to the present invention, the pixels PX spaced apart from each other around the module hole MH may be connected to each other by the signal lines passing through the blocking groove BR to improve organic bonding between the pixels PX spaced apart from each other around the module hole MH. Thus, it is possible to facilitate electrical control of the pixels PX spaced apart from each other around the module hole MH.

The blocking groove BR is located adjacent to the module hole MH. In more detail, the blocking groove BR may be arranged to surround the module hole MH. The module hole MH passes through the display panel DP. For example, the module hole MH illustrated in FIG. 2a may have a cylindrical shape with a height in the third direction DR3.

The module hole MH overlaps the electronic module ID in the plan view. The electronic module ID may be inserted into the module hole MH. In addition, the electronic module ID may be located on a rear surface of the base substrate 10 adjacent to the module hole MH, and only one component of the electronic module ID may be exposed to the outside through the module hole MH. For example, only a lens provided in a camera module CMM may be exposed to the outside through the module hole MH. Alternatively, the electronic module ID may be located on the rear surface of the base substrate 10 and be spaced apart from the display panel DP on a cross-section.

The display panel DP according to an embodiment of the present invention may include the module hole MH defined in the display area DA and thus may not provide a separate space for the electronic module ID to the outside of the display area DA. Thus, the peripheral area may be reduced in a surface area to realize the electronic apparatus EA having a narrow bezel. Also, when the electronic module ID is accommodated in the module hole MH, a compact electronic apparatus EA may be realized. A detailed description of the blocking groove BR and the module hole MH will be described later.

The window member WD is located on the front surface of the electronic apparatus EA. The window member WD may be located on the front surface of the display panel DP to protect the display panel DP. For example, the window member WD may include a glass substrate, a sapphire substrate, or a plastic film. The window member WD may have a single layer or multilayered structure. For example, the window member WD may have a laminated structure of a plurality of plastic films bonded to each other by using an adhesive or a laminated structure of a glass substrate and a plastic film, which are bonded to each other by using an adhesive.

The window member WD may include a transparent material to provide the transmission area TA and the bezel area BZA of the electronic apparatus EA. According to this embodiment, the transmission area TA may correspond to the display area DA. For example, the transmission area TA overlaps an entire surface of at least a portion of the display area DA. The image IM displayed on the display area DA of the display panel DP may be visible through the transmission area TA from the outside.

The bezel area BZA is defined according to a shape of the transmission area TA. The bezel area BZA may be located adjacent to the transmission area TA to surround the transmission area TA. The bezel area BZA may have a predetermined color. The bezel area BZA may cover the peripheral area NDA of the display panel DP to prevent the peripheral area NDA from being visible from the outside. However, this is merely an example. For example, in the window member WD according to an embodiment of the present invention, the bezel area BZA may be omitted.

The housing member HS may be coupled to the window member WD. The housing member HS may be provided on the rear surface of the electronic apparatus EA. The housing member HS be coupled to the window member WD to provide an inner space. The display panel DP, the electronic module ID, and various components of FIG. 3 may be accommodated in the inner space. The housing member HS may include a material having relatively high rigidity. For example, the housing member HS may include a plurality of frames and/or plates, which are made of glass, plastic, and a metal. The housing member HS may stably protect the components of the electronic apparatus EA, which are accommodated in the inner space, against an external impact.

The power supply module PM supplies power required for an overall operation of the electronic apparatus EA. The power supply module PM may include a general battery module.

The electronic module ID includes various functional modules for driving the electronic apparatus EA. The electronic module ID may include a first electronic module EM1 and a second electronic module EM2.

The first electronic module EM1 may be directly mounted on a mother board electrically connected to the display module DD or may be mounted on a separate board and electrically connected to the mother board through a connector (not shown).

The first electronic module EM1 may include a control module CM, a wireless communication module TM, an image input module IIM, an audio input module AIM, a memory MM, and an external interface EF. A portion of the modules may not be mounted on the mother board but electrically connected to the mother board through a flexible circuit board.

The control module CM controls the overall operation of the electronic apparatus EA. The control module CM may be a microprocessor. For example, the control module CM may activate or inactivate the display module DD. The control module CM may control other modules such as the image input module IS or the audio input module AIM based on a touch signal received from the display module DD.

The wireless communication module TM may transmit/receive a wireless signal to/from the other terminal by using Bluetooth or Wi-Fi line. The wireless communication module TM may transmit/receive an audio signal by using a general communication line. The wireless communication module TM includes a transmitter TM1 modulating and transmitting a signal to be transmitted and a receiver TM2 demodulating the received signal.

The image input module IS processes the image signal to convert the processed image signal into image data that is capable of being displayed on the display module DD. The audio input module AIM receives external audio signals by using a microphone during recording mode or a voice recognition mode to convert the received audio signal into electrical sound data.

Data recessed from the image wireless communication module TM, the input module IS, and the audio input module AIM may be stored in the memory MM so as to be used, and the used data may be deleted from the memory MM. In addition, data required for controlling the second electronic module EM2 may be stored in or deleted from the memory MM.

The external interface EF serves as an interface connected to an external charger, a wired/wireless data port, and a card socket (for example, a memory card and an SIM/UIM card).

The second electronic module EM2 may include an audio output module AOM, a light emitting module LM, a light receiving module LRM, and a camera module CMM. The above-described components may be directly mounted on the mother board, may be mounted on a separate substrate and electrically connected to the display module DD through a connector, or may be electrically connected to the first electronic module EM1.

The audio output module AOM converts audio data received from the wireless communication module TM or audio data stored in the memory MM to output the converted audio data to the outside.

The light emitting module LM generates and outputs light. The light emitting module LM may output infrared rays. The light emitting module LM may include an LED. The light receiving module LRM may sense the infrared rays. The light receiving module LRM may be activated when infrared rays having a predetermined level or more is sensed. The light receiving module LRM may include a CMOS sensor. The infrared rays generated in the light emitting module LM may be outputted and then be reflected by an external object (for example, a user's finger or face), and the reflected infrared rays may be incident into the light receiving module LRM. The camera module CMM photographs a subject.

The electronic module ID of FIG. 2*a* may be, particularly, at least one of the components of the second electronic module EM2. Here, the remaining components of the components of the first electronic module EM1 and the second electronic module EM2 may be located at different positions and thus may not be illustrated. For example, the electronic module ID may include at least one of an audio output module AOM, a light emitting module LM, a light receiving module LRM, or a camera module CMM.

As illustrated in FIG. 4*a*, the display panel DP includes a base substrate BS, a thin element layer TX, and a display element layer DX. The base substrate BS, the thin element layer TX, and the display element layer DX may be laminated along the third direction DR3. The thin element layer TX and the display element layer DX according to the present invention may constitute a pixel layer PL.

The base substrate BS includes a glass substrate, a metal substrate, and a flexible plastic substrate. However, the embodiment of the present invention is not limited thereto. For example, the base substrate BS may be a substrate in which a base layer containing an organic material and a barrier layer containing an inorganic material are alternately arranged in plurality. For example, the organic material of the base layer may include at least one of polyimide (PI), polyethylene naphthalate (PEN), polyethylene terephthalate (PET), polyarylate, polycarbonate (PC), polyetherimide (PEI), or polyethersulfone (PES). Thus, the base substrate BS according to an embodiment of the present invention may be rigid or flexible, but is not limited to any one embodiment.

The thin element layer TX includes a lower insulating layer IC, an interlayer insulating layer IH, and a thin film transistor TR. The thin element layer TX is located on the base substrate BS. Each of the lower insulating layer IC and the interlayer insulating layer IH may include an inorganic material and/or an organic material. The lower insulating layer IC may include a first insulating layer IL1 and a second insulating layer IL2.

The thin film transistor TR includes a semiconductor pattern SL, a control electrode CE, an input electrode IE, and an output electrode OE. The thin film transistor TR controls movement of charges in the semiconductor pattern SL through the control electrode CE to output an electrical signal inputted from the input electrode IE through the output electrode OE. The semiconductor pattern SL is located on the base substrate BS. The semiconductor pattern SL may include a crystalline semiconductor material or amorphous silicon. Although the control electrode CE is located on the semiconductor pattern SL in the transistor TR according to an embodiment of the present invention, the embodiment of the present invention is not limited thereto. For example, the thin film transistor TR may have a bottom-gate structure in which the control electrode CE is located on the base substrate BS and covered by the first insulating layer IL1, and the semiconductor pattern SL is located on the first insulating layer IL1, but is not limited to any one embodiment.

The first insulating layer IL1 may be located between the semiconductor pattern SL and the control electrode CE. The first insulating layer IL1 covers the base substrate BS and the semiconductor pattern SL.

The control electrode CE is illustrated as being located on the semiconductor pattern SL. However, this is merely an example. For example, the thin film transistor TR according to an embodiment of the present invention may include the semiconductor pattern SL located on the control electrode CE, but is not limited to any one embodiment.

The second insulating layer IL2 may be located between the control electrode CE and the input electrode IE and between the control electrode CE and the output electrode OE. The second insulating layer IL2 covers the first insulating layer IL1 and the control electrode CE.

The input electrode IE and the output electrode OE are located on the second insulating layer IL2. The input electrode IE and the output electrode OE are connected to the semiconductor pattern SL through the first insulating layer IL1 and the second insulating layer IL2, respectively. However, this is merely an example. For example, the input electrode IE and the output electrode OE may be directly connected to the semiconductor pattern SL.

The interlayer insulating layer IH is located on the second insulating layer IL2. The interlayer insulating layer IH may cover the thin film transistor TR. The interlayer insulating layer IH may be located between the thin film transistor TR and the display element layer DX to electrically insulate the thin film transistor TR from the display element layer DX.

The display element layer DX includes a pixel defining layer PLE, an organic light emitting element ED, and an encapsulation layer TFE.

The pixel defining layer PLE is located on the interlayer insulating layer IH. A plurality of openings may be defined in the pixel defining layer PLE. The organic light emitting element ED may be provided in each of the openings.

The organic light emitting element ED includes a first electrode E1, a second electrode E2, a light emitting layer EL, and a charge control layer OL. The first electrode E1 is located on the interlayer insulating layer IH. The first electrode E1 may be electrically connected to the thin film transistor TR by passing through the interlayer insulating layer IH. The first electrode E1 may be provided in plurality. At least a portion of each of the plurality of first electrodes E1 may be exposed by the corresponding opening.

The second electrode E2 is located on the first electrode E1. The second electrode E2 may have an integrated shape overlapping the plurality of first electrodes and a first inorganic layer LIL. When the organic light emitting element ED is provided in plurality, the second electrode E2 may have the same voltage for each of the organic light emitting elements. Thus, a separate patterning process for forming the second electrode E2 may be omitted. This is merely an example. For example, the second electrode E2 may be provided in plurality to correspond to the openings.

The light emitting layer EL is located between the first electrode E1 and the second electrode E2. The light emitting layer EL may be provided in plurality, and the plurality of light emitting layers EL may be respectively located on the openings. The organic light emitting element ED may activate the light emitting layer EL according to a potential difference between the first electrode E1 and the second electrode E2 to generate light.

The charge control layer OL is located between the first electrode E1 and the second electrode E2. The charge control layer OL is located adjacent to the light emitting layer EL. In this embodiment, the charge control layer OL is located between the light emitting layer EL and the second electrode E2. However, this is merely an example. For example, the charge control layer OL may be located between the light emitting layer EL and the first electrode E1 and may be provided as a plurality of layers that are laminated in the third direction DR3 with the light emitting layer EL therebetween.

The charge control layer OL may be integrated to overlap the front surface of the base substrate BS without a separate patterning process. The charge control layer OL may be located on an area except for the openings defined in the pixel defining layer PLE. The charge control layer OL may control movement of electrons to improve light emitting efficiency. The charge control layer OL may include an electron transport layer and an electron injection layer.

The encapsulation layer TFE is located on the organic light emitting element ED. The encapsulation layer may include an inorganic layer and/or an organic layer. In this embodiment, the encapsulation layer TFE may include a first inorganic layer LIL, an organic layer OEL, and a second inorganic layer UIL.

Each of the first inorganic layer LIL and the second inorganic layer UIL may include an inorganic material. For example, each of the first inorganic layer LIL and the second inorganic layer UIL may include at least one of aluminum oxide, silicon oxide, silicon nitride, silicon oxynitride, silicon carbide, titanium oxide, zirconium oxide, or zinc oxide. The first inorganic layer LIL and the second inorganic layer UIL may include the same material or different materials.

The organic layer OEL may be located between the first inorganic layer LIL and the second inorganic layer UIL. The organic layer OEL may include an organic material. For example, the organic layer (OEL) may include at least one of epoxy, polyimide (PI), polyethylene terephthalate (PET), polycarbonate (PC), polyethylene (PE), or polyacrylate.

The first inorganic layer LIL and the second inorganic layer UIL may have an integrated shape to be located on the front surface of the display panel DP in the plan view. Each of the first inorganic layer LIL and the second inorganic layer UIL may partially overlap the organic layer OEL. Thus, the first inorganic layer LIL and the second inorganic layer UIL may be spaced apart from each other in the third direction DR3 with the organic layer OEL therebetween on one portion of the area and directly contact each other in the third direction on the other portion of the area. The encapsulation layer TFE may seal the organic light emitting element ED to protect the organic light emitting element ED against foreign substances introduced from the outside.

The display panel may further include a dam part DMP. The dam part DMP may extend along an edge of the display area DA. The dam part DMP may surround the display area DA or be located at at least one side of the display area, for example, at a side adjacent to a pad (not shown) or a driving circuit (not shown).

The dam part DMP may be defined as an area into which a liquid organic material is spread in a process of forming the organic layer OEL. The organic layer OEL may be manufactured in an inkjet manner in which the liquid organic material is applied to the first inorganic layer LIL. Here, the dam part DMP may set a boundary of an area, on which the liquid organic material is located, and prevent the liquid organic material from overflowing to the outside.

The module hole MH is located on the hole area PA. The module hole MH may pass through the base substrate BS. The module hole MH may be formed by removing portions of the base substrate BS, the lower insulating layer IC, the charge control layer OL, the first inorganic layer LIL, and the second inorganic layer UIL.

The module hole MH may be defined as ends of a penetrated component of the components of the display panel DP. For example, an end of the base substrate, an end of the lower insulating layer, an end of the charge control layer OL, an end of the first inorganic layer, and an end of the second inorganic layer may be aligned to define an inner surface GE of the module hole MH.

The blocking groove BR is located in the hole area PA. The blocking groove BR may be a region through which some of the insulating layers are removed to pass. The blocking groove BR may have an under-cut shape formed during a process of etching the insulating layers. The blocking groove BR according to the present invention may be defined to pass through the interlayer insulating layer IH. As the interlayer insulating layer IH is penetrated, a portion of the lower insulating layer IC may be exposed. FIG. 4a illustrates the blocking groove BR defined by exposing a portion of the second insulating layer IL2 of the lower insulating layer IC. An inner surface of the blocking groove BR may be covered by the first inorganic layer LIL.

In this embodiment, an additional pattern part OL-P may be located on a portion OL-P (see FIG. 5a) of a top surface of the second insulating layer IL2 that is partially exposed as the interlayer insulating layer IH is penetrated. The additional pattern part OL-P may be formed during a process of depositing the charge control layer OL after the blocking groove BR is formed. In this embodiment, the additional pattern part OL-P including the same material as the charge control layer OL has been described, but the present invention is not limited thereto. For example, the material is not limited thereto if a material is capable of being provided for the deposition of the organic light emitting element ED.

According to the present invention, since the blocking groove BR surrounding the module hole MH is defined in the interlayer insulating layer IH covering the thin film transistor TR, even if the base substrate BS is rigid, moisture and oxygen to be introduced into the blocking groove BR may be easily blocked.

As illustrated in FIG. 4a, the filling member FM located inside the blocking groove BR is further provided. For example, the filling member FM may contact the first inorganic layer LIL. Since the filling member FM is made of an organic material, an inner space of the blocking groove BR may be easily filled. For example, the filling member FM may include the same material as the organic layer OEL.

Thus, the organic layer OEL and the filling member FM may be formed at the same time through one process to simplify the process reduce the process cost. However, this is merely an example. For example, the filling member FM may be formed independently from the process of forming the organic layer OEL by using a material different from that of the organic layer OEL, but is not limited to any one embodiment.

Referring to FIG. 4b, unlike FIG. 4a, the inside of the blocking groove BR may be provided as an empty space. That is, the filling member FM may not be located inside the blocking groove BR and be covered by the first inorganic layer LIL.

Figure 5A:
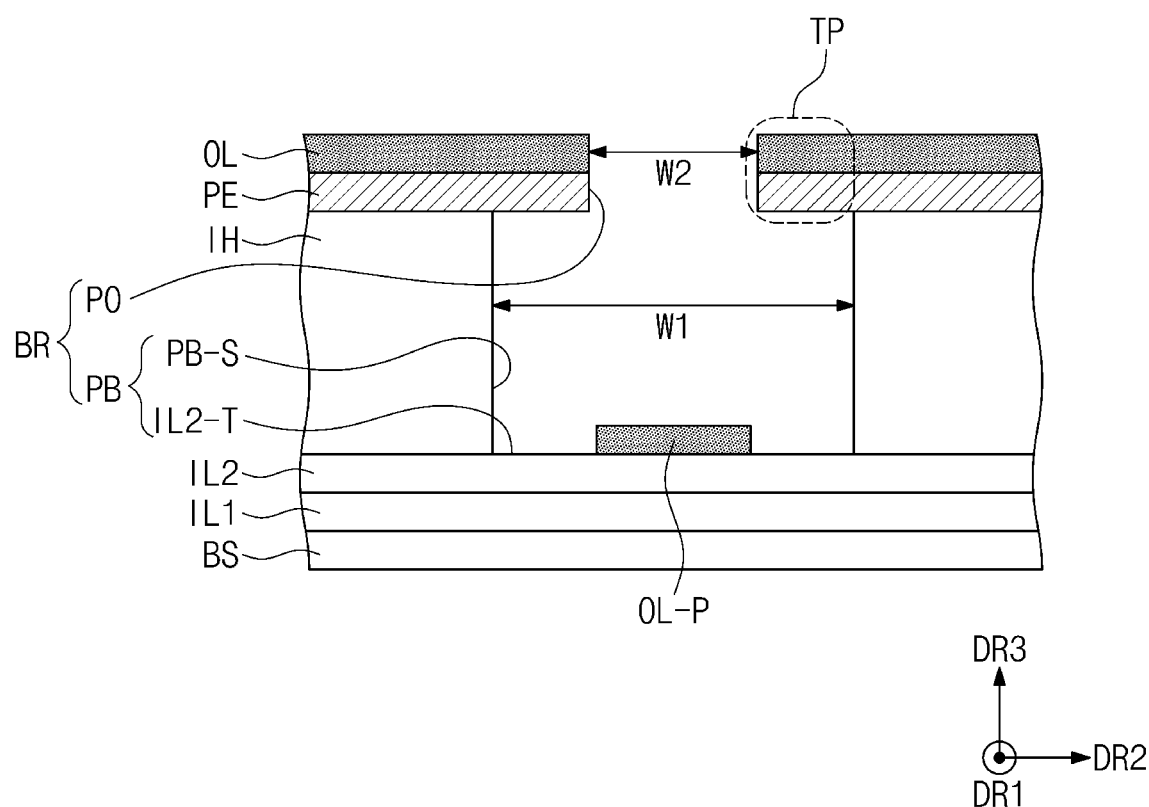
Figure 5B:
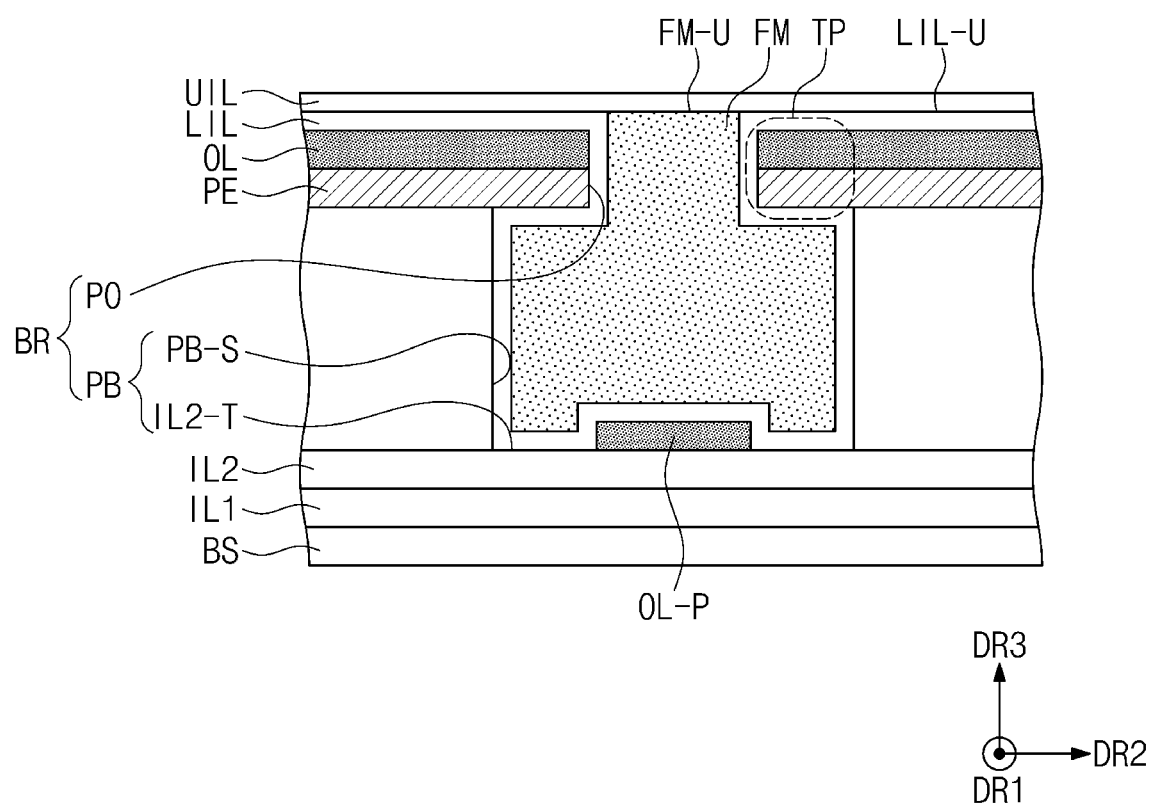

FIGS. 5a and 5b are enlarged cross-sectional views of the hole area of FIG. 4a. FIG. 5A illustrates a configuration in which the filling member FM, the first inorganic layer LIL, and the second inorganic layer UIL in the blocking groove BR illustrated in FIG. 4a are omitted for convenience of description.

The under-cut shape of the blocking groove BR may be defined by a pattern part PB and an opening PO. The pattern part PB may be defined by a portion IL2-T of a top surface of the second insulating layer IL2 exposed through the interlayer insulating layer IH and an inner surface PB-S of the interlayer insulating layer IH connected to the portion IL2-T of the top surface.

The opening PO overlaps the pattern part PB in the plan view. The opening PO may be defined by the pattern electrode PE. The opening PO may be defined to pass through the pattern electrode PE. A planar area of the opening PO according to an embodiment may be less than or equal to that of the pattern part PB.

The pattern electrode PE according to the present invention may be located on the same layer as the first electrode E1 (see FIG. 4a). The pattern electrode PE may include the same material as the first electrode E1. That is, the pattern electrode PE may be formed by being applied to the hole area PA during the process of forming the first electrode E1.

The control charge layer OL may be located on the pattern electrode PE according to the present invention. The charge control layer OL located in the hole area PA may be located so as not to overlap the opening PO.

Each of inner surfaces of the pattern part PB have a first width W1 in the second direction DR2. The opening PO has a second width W2 in the second direction DR2. In this embodiment, the second width W2 may be less than the first width W1. Thus, the pattern electrode PE defining the opening PO has a shape protruding from an inner surface PB-S, and thus, the blocking groove BR may have an under-cut shape.

According to an embodiment of the present invention, the display panel DP in which the blocking groove BR is defined includes a tip portion TP constituted by a portion of each of the pattern electrode PE and the charge control layer OL. The tip portion TP may be defined as a region protruding from the inner surface PB-S of the pattern part PB. The tip portion TP may be formed by the under-cut during the process. Since the pattern electrode PE is relatively rigid compared to the charge control layer OL, a portion of the charge control layer OL may be supported by the pattern electrode PE without being depressed into the pattern part PB. Thus, a portion of each of the pattern electrode PE and the charge control layer OL located on the pattern electrode PE may constitute the tip portion TP of the blocking groove BR.

FIG. 5b illustrates a configuration in which the filling member FM, the first inorganic layer LIL, and the second inorganic layer UIL are added to the components illustrated in FIG. 5a.

The first inorganic layer LIL may cover the inner surface of the blocking groove BR. Thus, the first inorganic layer LIL directly contacts the components defining the blocking groove BR.

The filling member FM is located in the blocking groove BR. In more detail, the filling member FM is located inside the blocking groove BR covered by the first inorganic layer LIL.

The filling member FM contacts the first inorganic layer LIL surrounding the inside of the blocking groove BR. The filling member FM and the first inorganic layer LIL are covered by the second inorganic layer UIL. For example, a top surface FM-U of the filling member FM and a top surface LIL-U of the first inorganic layer LIL adjacent to the top surface FM-U are covered by the second inorganic layer UIL. Thus, according to an embodiment, the top surface LIL-U of the first inorganic layer LIL adjacent to the blocking groove BR directly contacts the second inorganic layer UIL.

The filling member FM according to the present invention is located inside the blocking groove BR to support the tip portion TP. The display panel DP having improved impact strength because the filling member FM supports the tip portion TP may be provided.

Also, in the display panel DP according to the present invention, since a portion IL2-T of the top surface of the second insulating layer IL2 constituting the pattern part PB of the blocking groove BR and a portion of the pattern electrode PE protruding from the pattern part PB are surrounded by the first inorganic layer LIL, the display panel DP having improved reliability by blocking moisture and oxygen introduced from the module hole MH may be provided.

Figure 6A:
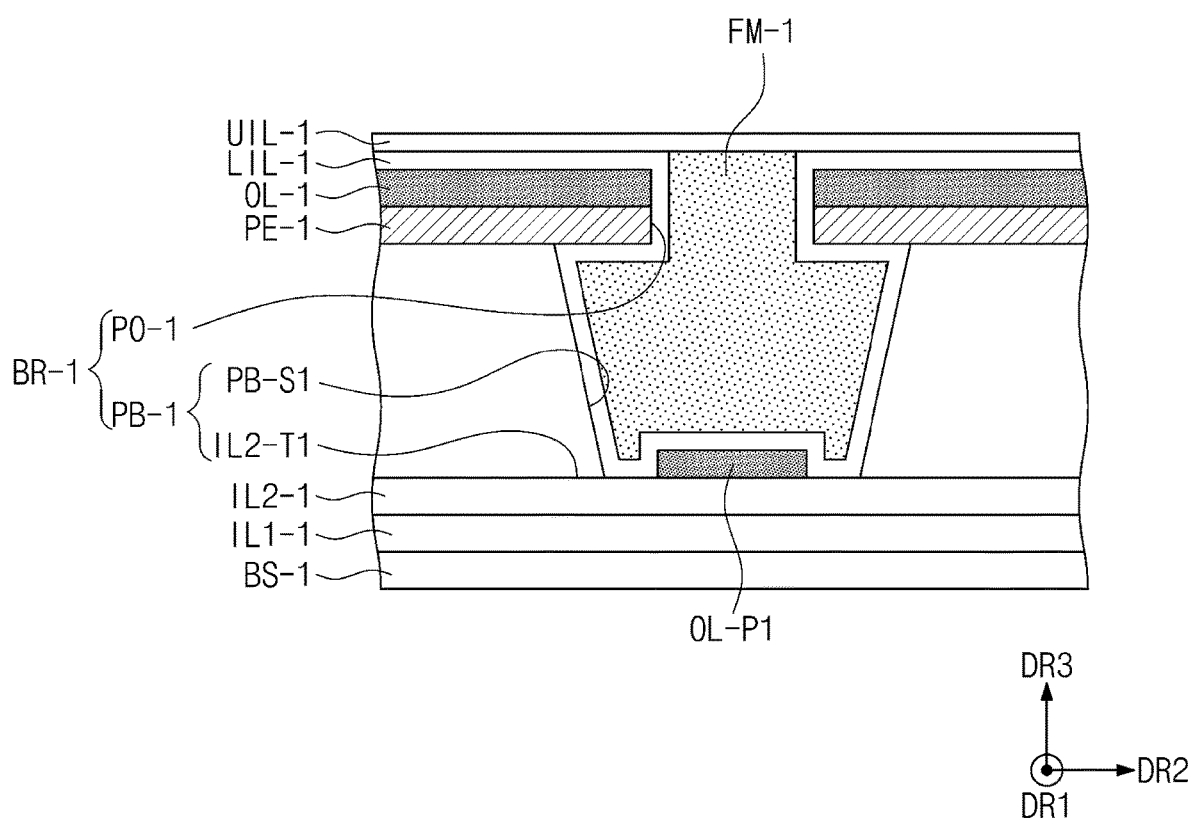
FIGS. 6a to 6c are cross-sectional views illustrating a portion of a display panel according to the present invention.
Figure 6B:
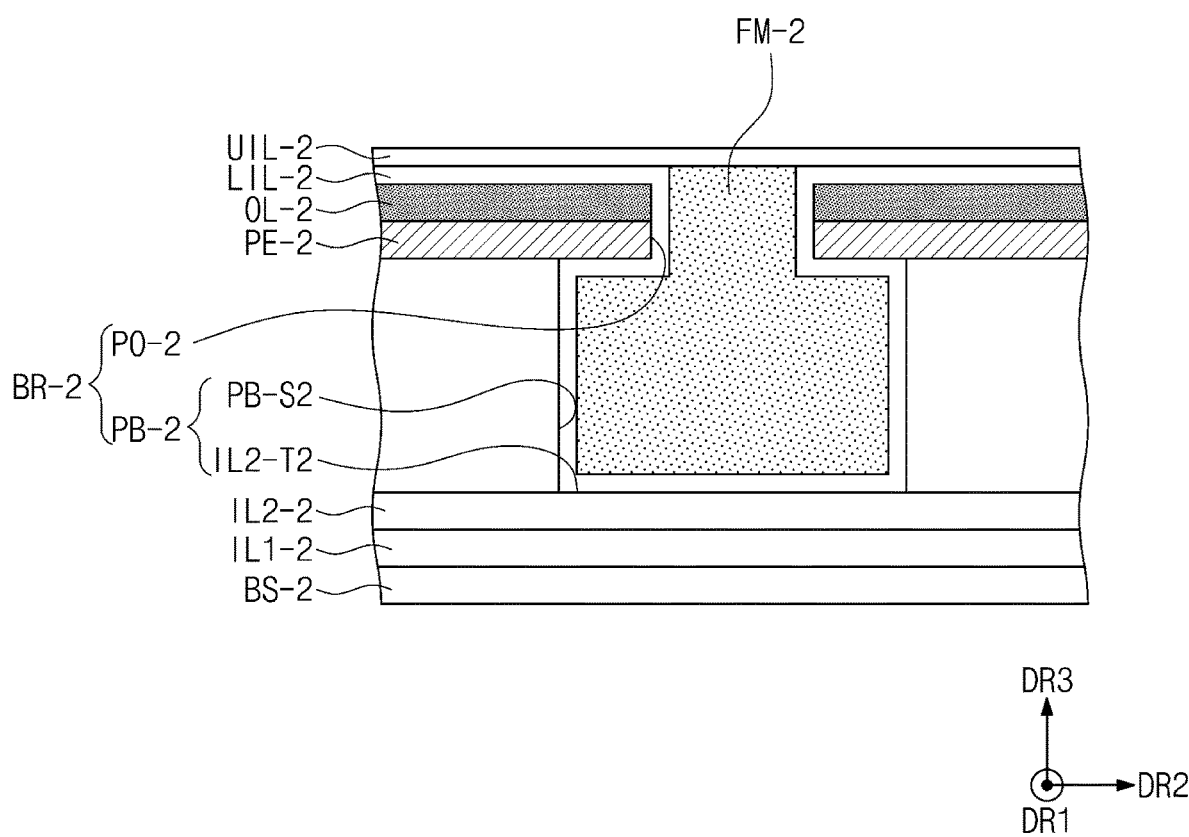
Figure 6C:
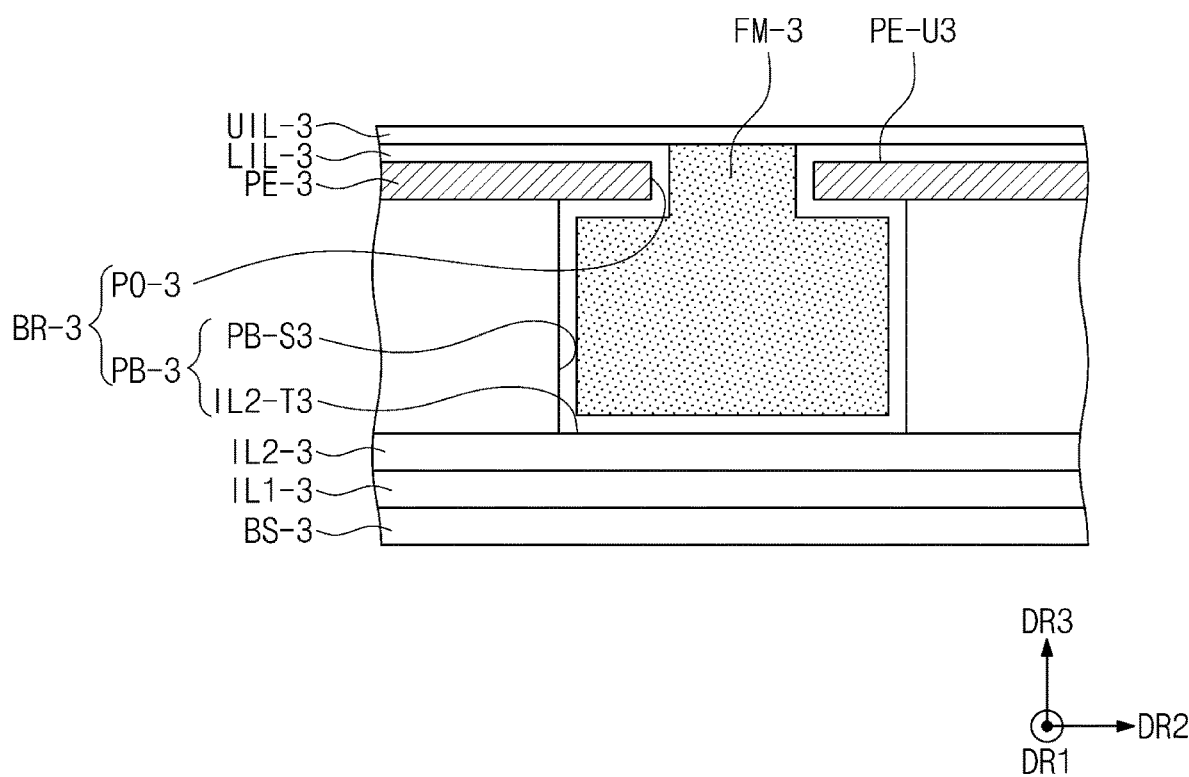

FIGS. 6a to 6c are cross-sectional views illustrating a portion of the display panel according to the present invention. The same reference numerals are used for the same components as that of FIGS. 1 to 5b, and thus, duplicated descriptions will be omitted.

Referring to FIG. 6a, unlike the blocking groove BR illustrated in FIG. 5a, a pattern part PB-1 may be provided as a through-portion having a width varying along the third direction DR3. The pattern part PB-1 includes an inner surface PB-SC.

Referring to FIG. 6b, according to an embodiment of the present invention, unlike that illustrated in FIG. 5a, the organic pattern OL-P (see FIG. 5A) may be omitted. Thus, the first inorganic layer LIL-2 may cover an entire surface of a portion IL2-T2 of the top surface of the second insulating layer IL2-2 exposed by the blocking groove BR-2.

Referring to FIG. 6c, unlike FIG. 6b, a top surface PE-U3 of the pattern electrode PE-3 may be directly located on the first inorganic layer LIL-3. Thus, the charge control layer OL may be omitted on the pattern electrode PE-3 adjacent to the blocking groove BR-3.

FIGS. 6a to 6c illustrate the filling members FM-1, FM-2, and FM-3, which contact the first inorganic layers LIL-1, LIL-2, and LIL-3, but are limited thereto. For example, the filling members FM-1, FM-2, and FM-3 may be omitted as in the embodiment of FIG. 5b.

FIGS. 7 to 9b are cross-sectional views illustrating a portion of the display panel according to an embodiment of the present invention. The same reference numerals are used for the same components as that of FIGS. 1 to 5b, and thus, duplicated descriptions will be omitted.

Figure 7:
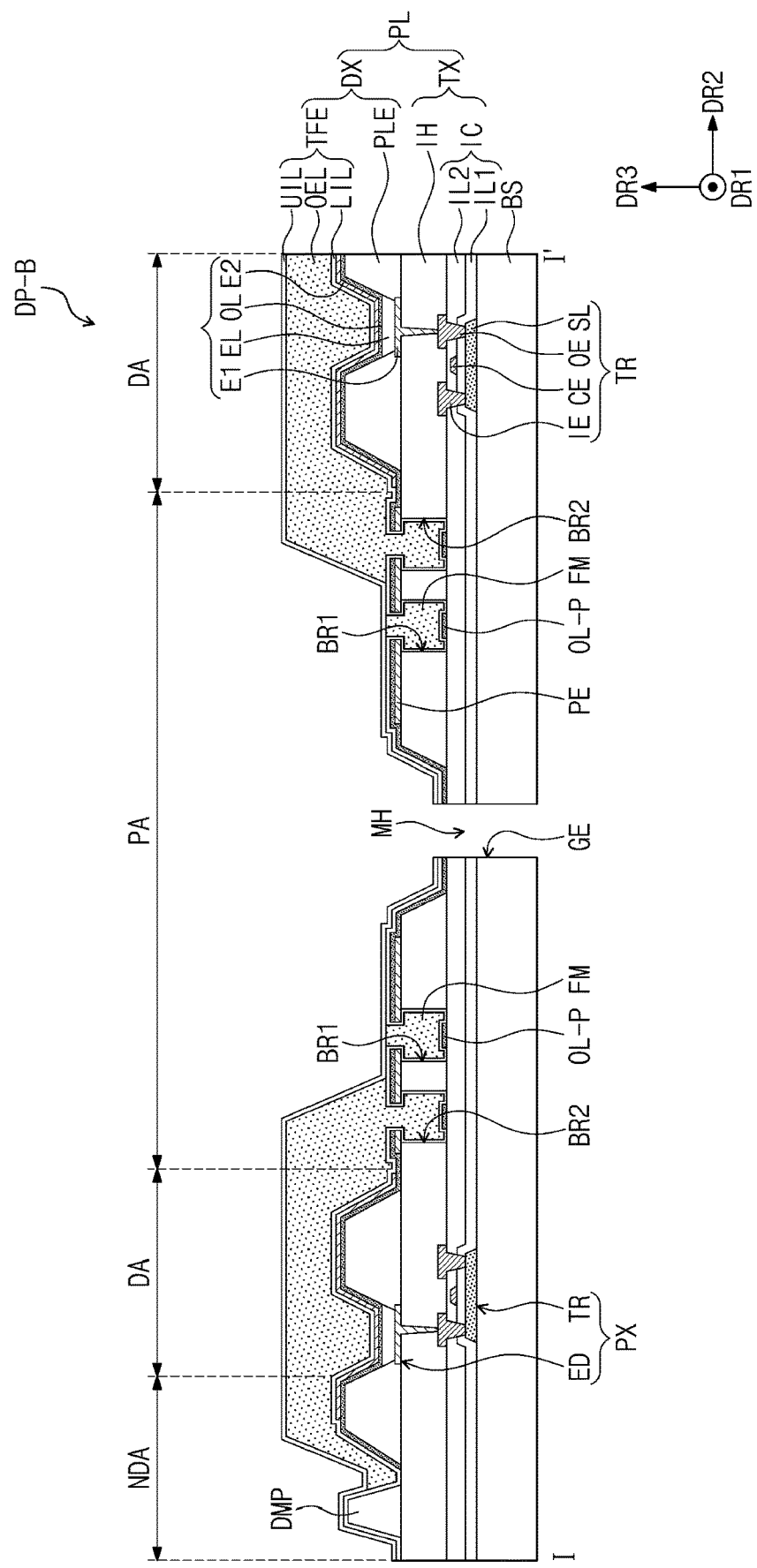
FIG. 7 is a cross-sectional view illustrating a portion of the display panel according to an embodiment of the present invention.

Referring to FIG. 7, a display panel DP-B according to an embodiment further includes a second blocking groove BR2. A first blocking groove BR1 may correspond to the blocking groove BR described in FIG. 4a. A portion of the organic layer OEL may overlap the hole area PA according to an embodiment.

The second blocking groove BR2 according to the present embodiment may be located between the first blocking groove BR1 and the organic light emitting element ED in the plan view. The second blocking groove BR2 is located to be spaced apart from the first blocking groove BR1. The second blocking groove BR2 may be located on the same layer as the first blocking groove BR1. Thus, the second blocking groove BR2 may be formed by passing through the interlayer insulating layer IH to expose a portion of the second insulating layer IL2.

The inner surface of the second blocking groove BR2 may be covered by the first inorganic layer LIL. The second blocking groove BR2 covered by the second inorganic layer UIL may be filled by the organic layer OEL. Thus, the filling member FM located in the first blocking groove BR1 includes the same material as the organic layer OEL filled in the second blocking groove BR2. As the interlayer insulating layer IH is penetrated, an additional pattern part OL-P may be located on the second insulating layer IL2 that is partially exposed.

Figure 8:
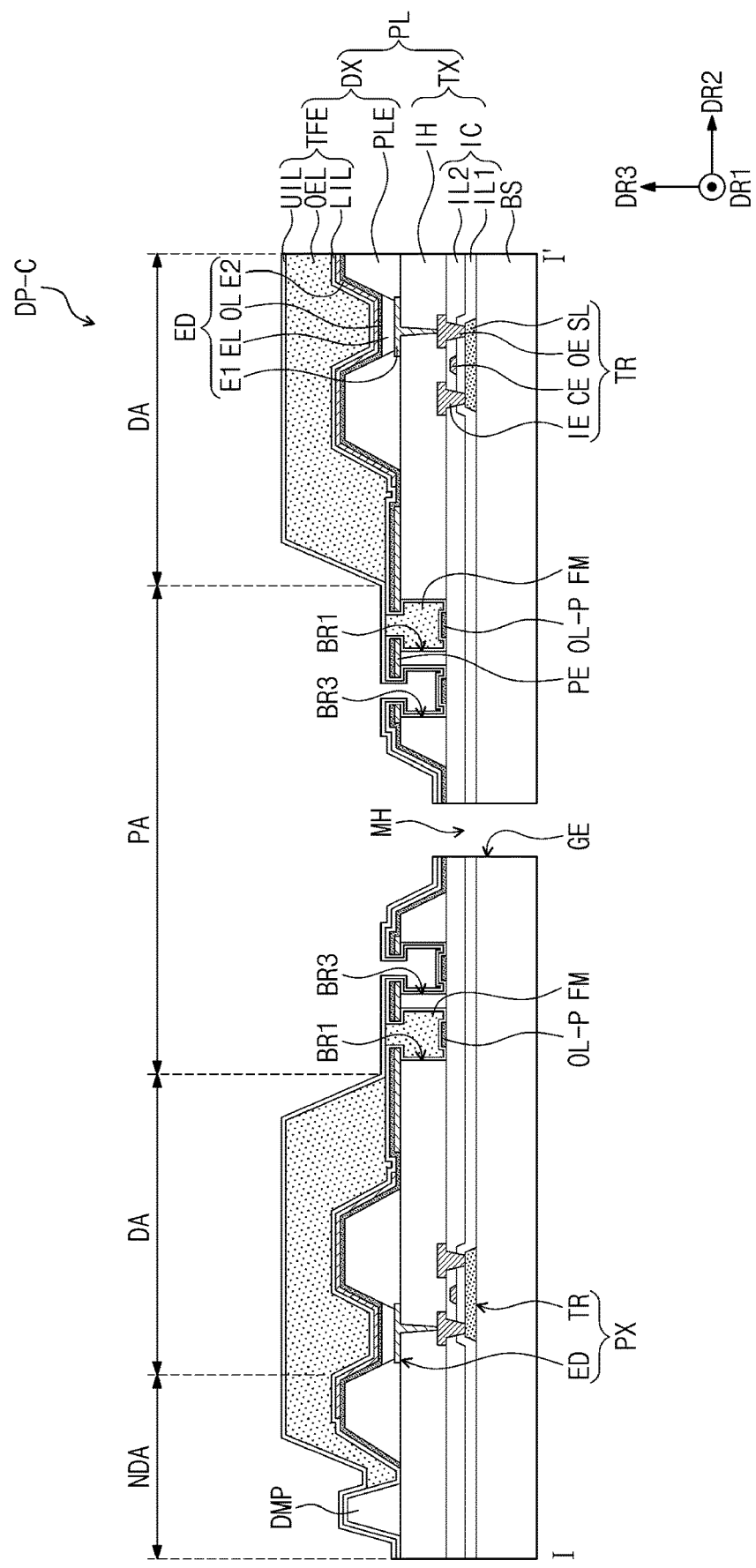
FIG. 8 is a cross-sectional view illustrating a portion of the display panel according to an embodiment of the present invention.

Referring to FIG. 8, a display panel DP-C according to an embodiment further includes a third blocking groove BR3. A first blocking groove BR1 may correspond to the blocking groove BR described in FIG. 4a.

The third blocking groove BR3 according to this embodiment may be located between the module hole MH and the first blocking groove BR1. The third blocking groove BR3 is arranged to be spaced apart from the first blocking groove BR1.

The third blocking groove BR3 is located on the same layer as the first blocking groove BR1. Thus, the third blocking groove BR3 may be formed by passing through the interlayer insulating layer IH to expose a portion of the second insulating layer IL2.

The inner surface of the third blocking groove BR3 may be covered by the first inorganic layer LIL. The inner surface of the first inorganic layer LIL1 covering an inner surface of the third blocking groove BR3 may be covered by the second inorganic layer UIL.

Figure 9A:
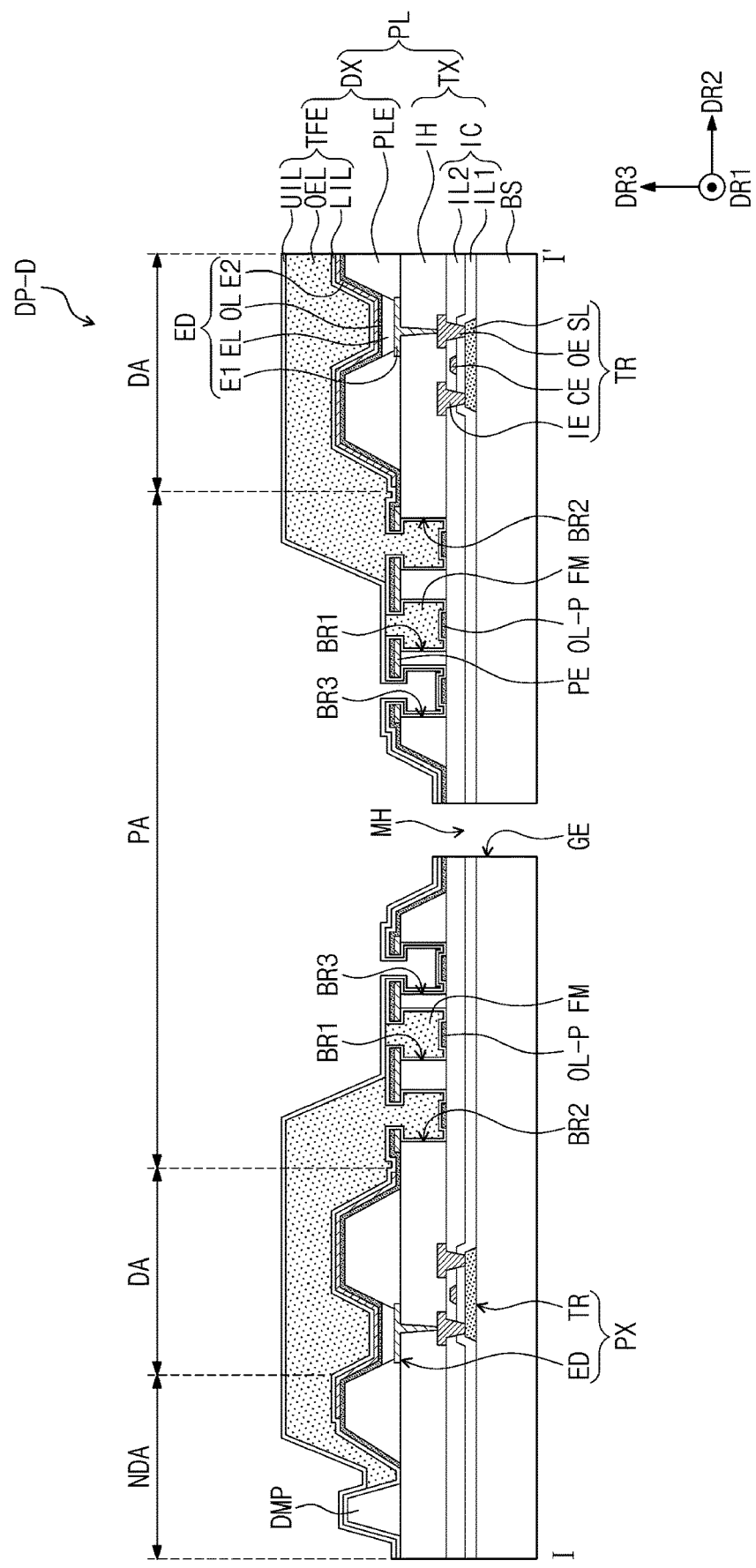
FIG. 9a is a cross-sectional view illustrating a portion of the display panel according to an embodiment of the present invention.

Referring to FIG. 9a, a display panel DP-D according to an embodiment further includes a first blocking groove BR1, a second blocking groove BR2, and a third blocking groove BR3. The first blocking groove BR1 may correspond to the blocking groove BR described in FIG. 4a, and the second blocking groove BR2 and the third blocking groove BR3 may correspond to the second blocking groove BR2 of FIG. 8 and the third blocking groove BR3 of FIG. 9a, respectively. For convenience of explanation, the additional pattern part OL-P located inside the filling member FM and the blocking groove BR is omitted.

Figure 9B:
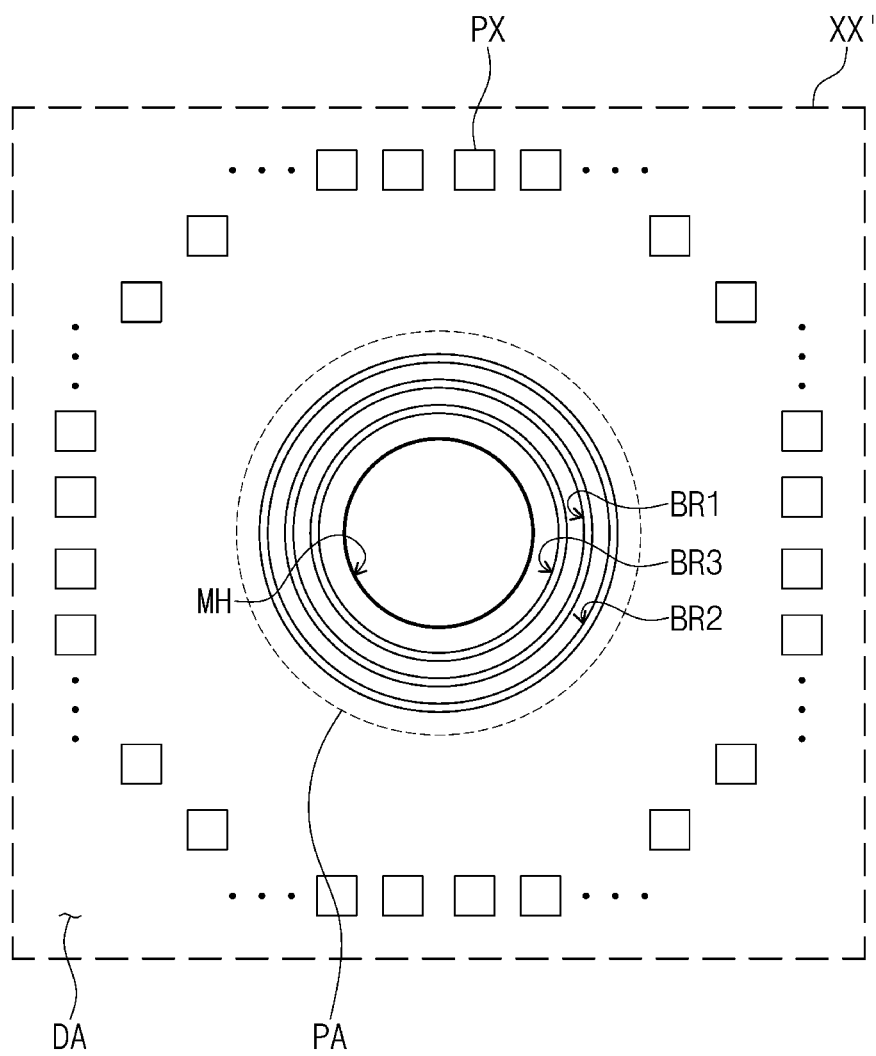

FIG. 9b illustrates a plan view of one area of FIG. 9a. Referring to FIG. 9b, the hole area PA may be an area in which the module hole MH and the blocking grooves BR1, BR2, and BR3 surrounding the module hole MH are defined. The display panel DP according to an embodiment may include at least one module hole MH. The first to third blocking grooves BR1, BR2, and BR3 may be located in the hole area PA.

The hole area PA according to an embodiment may be defined as a circular shape surrounding the first to third blocking grooves BR1, BR2, and BR3. A portion of the organic layer OEL may overlap the hole area PA.

Although not shown, a plan view illustrating the blocking grooves BR1 and BR2 of FIG. 7 may have a shape in which the third blocking groove BR3 adjacent to the module hole MH is removed from the display panel DP-D of FIG. 9b. Also, a plan view illustrating the blocking grooves BR1 and BR3 of FIG. 8 may be a shape in which the second blocking groove BR2 located in the display area DA is removed from the display panel DP-D of FIG. 9b. FIGS. 7 to 9a illustrate single first to third blocking grooves BR1 to BR3, but is not limited thereto. For example, each of the first blocking groove BR1 to the third blocking groove BR3 may be provided in plurality, but is not limited to any one embodiment.

In the display panels DP-B, DP-C, and DP-D according to the present invention, the first inorganic layer LIL may directly contact a portion IL2-T of the top surface of the second insulating layer IL2 constituting the blocking grooves and a portion of the protruding pattern electrode PE to block a moving path of moisture and oxygen, which are introduced from the outside. Thus, the display panel having the improved reliability may be provided.

Figure 10A:
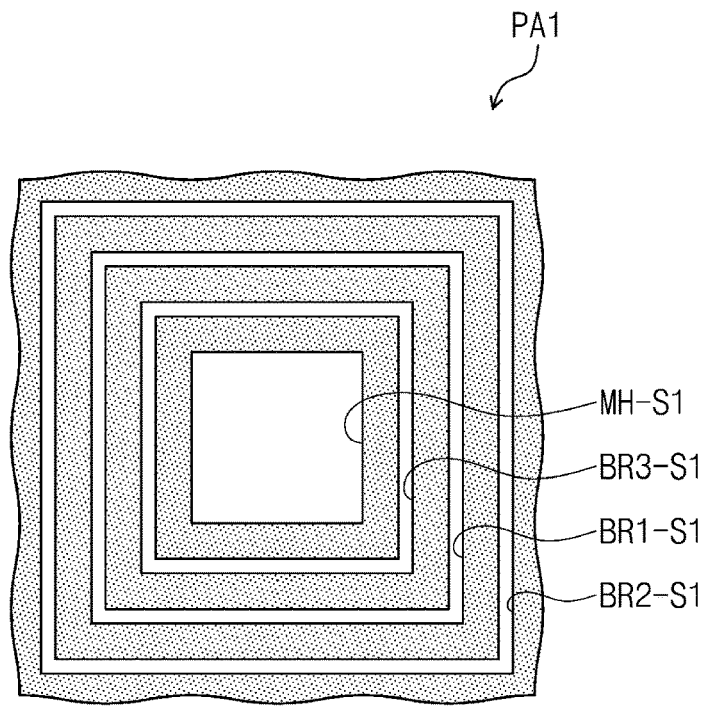
FIGS. 10a to 10c are plan views of hole areas according to an embodiment of the present invention.
Figure 10B:
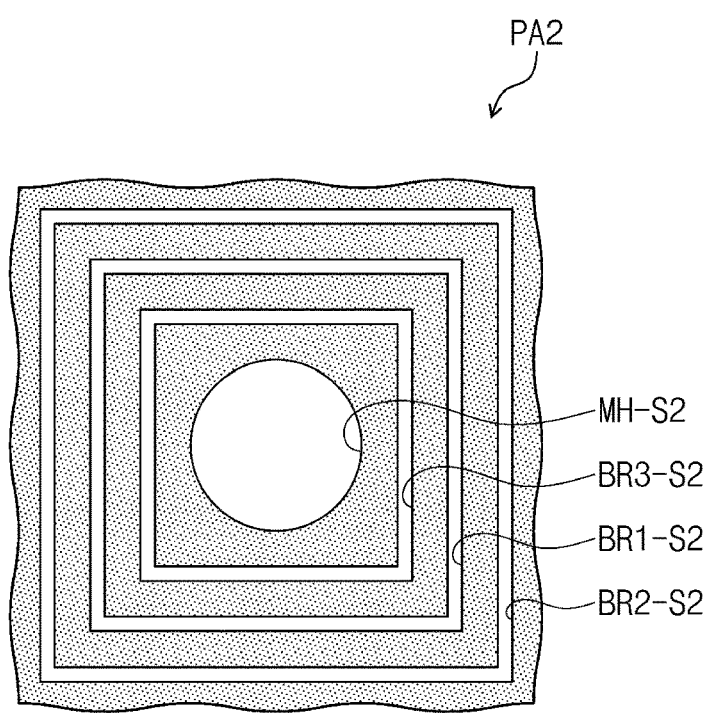
Figure 10C:
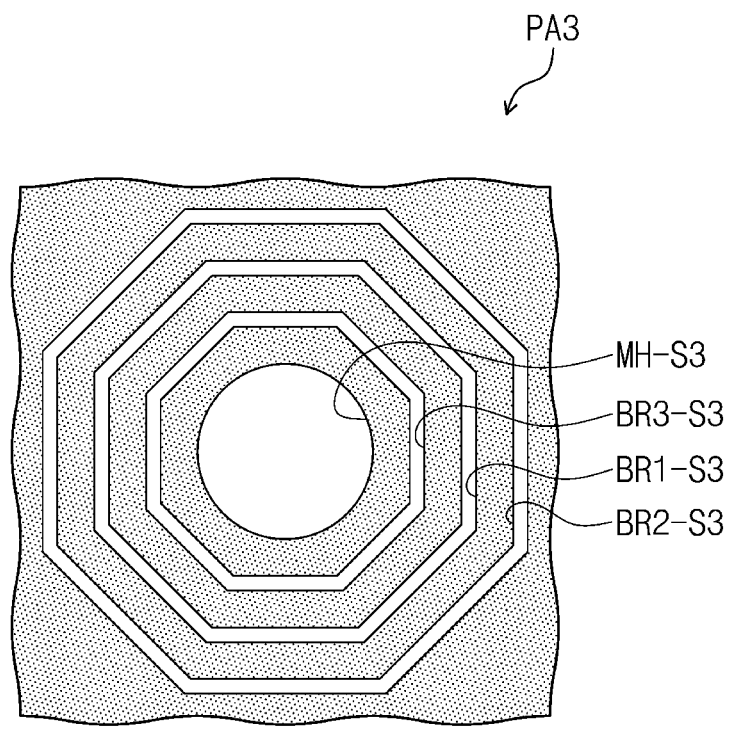

FIGS. 10a to 10c are plan views of hole areas according to an embodiment of the present invention. The same reference numerals are used for the same components as that of FIGS. 1 to 9b, and thus, duplicated descriptions will be omitted.

FIGS. 10a and 10b schematically illustrate the shapes of the first to third blocking grooves corresponding to FIG. 9b in the plan view. FIGS. 10a and 10b illustrate a shape of a closed curve formed by three blocking grooves, but the present invention is not limited thereto. For example, the number of closed curves may also vary according to the number of blocking holes. As illustrated in FIG. 10a, a hole area PA1 may include a module hole MH-S1 and blocking grooves BR1-S1, BR2-S1, and BR3-S1. The blocking grooves BR1-S1, BR2-S1, and BR3-S1 illustrated in FIG. 10a may correspond to the blocking grooves BR1, BR2, and BR3 illustrated in FIG. 9b, respectively.

A module hole MH-S1 may have a polygonal shape in the plan view. In this embodiment, the module hole MH-S1 is illustrated in a square shape. Here, the module hole MH-S1 is implemented in a polygonal column shape. The first blocking groove BR1-S1, the second blocking groove BR2-S1, and the third blocking groove BR3-S1 are arranged to be spaced apart from each other.

The blocking grooves BR1-S1, BR2-S1, and BR3-S1 are defined along an edge of the module hole MH-S1. According to an embodiment of the present invention, each of the blocking grooves BR1-S1, BR2-S1, and BR3-S1 may have a shape corresponding to the module hole MH-S1. Thus, the blocking grooves BR1-S1, BR2-S1, and BR3-S1 may have a planar shape of a rectangular closed curve surrounding the module hole MH-S1.

Alternatively, as illustrated in FIG. 10b, a hole area PA2 may include a module hole MH-S2 and blocking grooves BR1-S2, BR2-S2, and BR3-S2. Here, the module hole MH-S2 may have a shape different from that of each of the blocking grooves BR1-S2, BR2-S2, and BR3-S2. The blocking grooves BR1-S2, BR2-S2, and BR3-S2 illustrated in FIG. 10b may correspond to the blocking grooves BR1, BR2, and BR3 illustrated in FIG. 9a, respectively.

The module hole MH-S2 is illustrated to have a circular shape in the plan view. Each of the blocking grooves BR1-S2, BR2-S2, and BR3-S2 may have a shape different from that of the module hole MH-S2 in the plan view. In this embodiment, the blocking grooves BR1-S2, BR2-S2, and BR3-S2 are illustrated to have a planar shape of a rectangular closed curve. However, it is not limited thereto, and the blocking grooves BR1-S2, BR2-S2, and BR3-S2 may have various shapes if the blocking grooves BR1-S2, BR2-S2, and BR3-S2 are located adjacent to the module hole MH-S2 and may not be limited the shape corresponding to the shape of the module hole MH-S2.

Alternatively, as illustrated in FIG. 10c, a hole area PA3 may include a module hole MH-S3 and blocking grooves BR1-S3, BR2-S3, and BR3-S3. Here, the module hole MH-S3 may have a shape different from that of each of the blocking grooves BR1-S3, BR2-S3, and BR3-S3. The blocking grooves BR1-S3, BR2-S3, and BR3-S3 illustrated in FIG. 10c may correspond to the blocking grooves BR1, BR2, and BR3 illustrated in FIG. 9a, respectively. Here, each of the blocking grooves BR1-S3, BR2-S3, and BR3-S3 is illustrated to have a shape of an octagonal closed curve in the plan view.

According to the present invention, the more each of the blocking grooves BR1-S3, BR2-S3, and BS3-S3 have a shape similar to that of the module hole MH-S3 in the plan view, the more an area of a space between each of the blocking grooves BR1-S3, BR2-S3, and BS3-S3 and the module hole MH-S3 is reduced. Thus, the region occupied by the hole area PA3 provided within the display area DA (see FIG. 2a) may be reduced to deteriorate an effect of the hole area PA3 on the display area DA.

FIGS. 11a to 11f are cross-sectional views illustrating a method of manufacturing a display panel according to an embodiment of the present invention. The same reference numerals are used for the same components as that of FIGS. 1 to 9a, and thus, duplicated descriptions will be omitted.

Figure 11A:
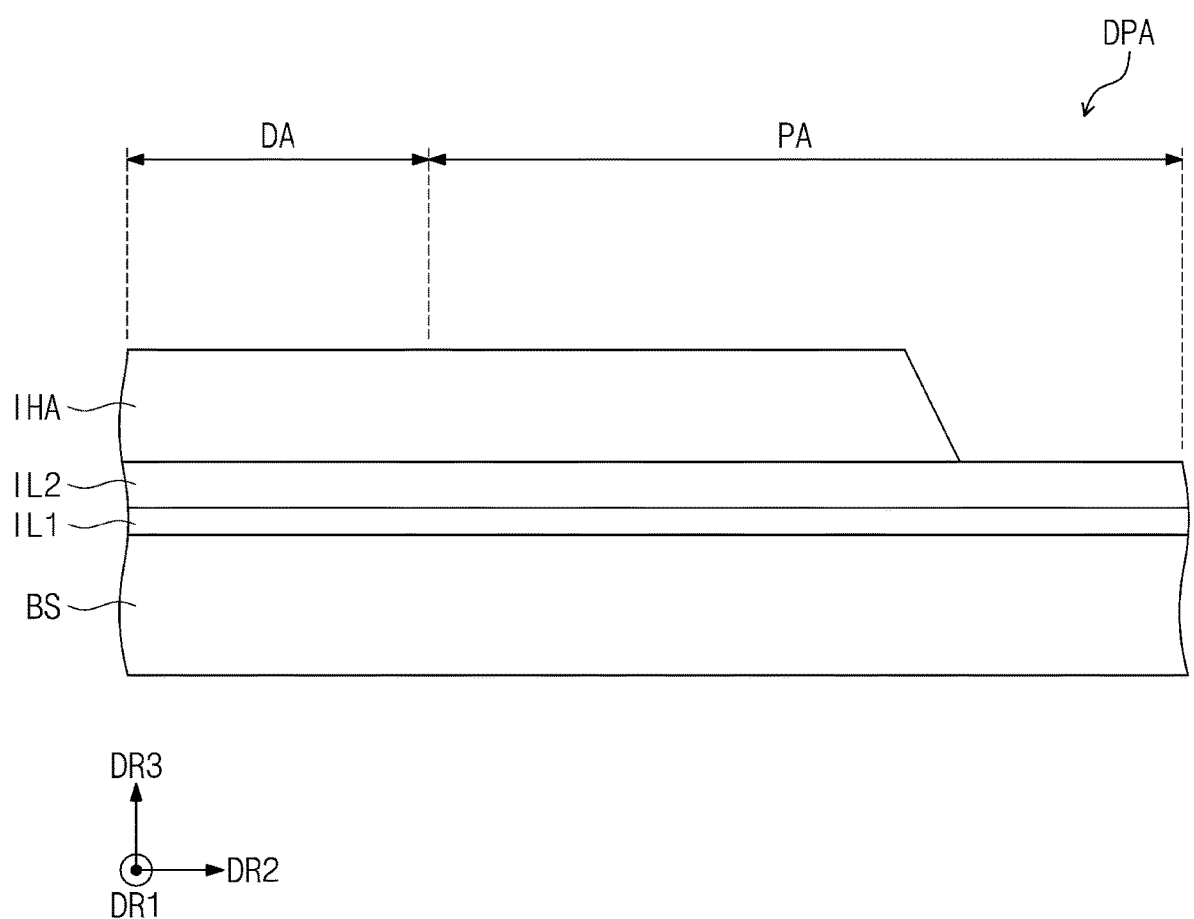
FIGS. 11a to 11h are cross-sectional views illustrating a method for manufacturing a display panel according to an embodiment of the present invention.

As illustrated in FIG. 11a, a first insulating layer IL1 may be applied on a base substrate BS. As illustrated in FIG. 4a, the first insulating layer IL1 may be formed between a control electrode CE and a semiconductor pattern SL. Thus, the first insulating layer IL1 electrically insulates the control electrode CE from the semiconductor pattern SL. A second insulating layer IL2 may be applied on the first insulating layer IL2. The second insulating layer IL2 according to the present invention may be formed between an input electrode IE, an output electrode OE, and a control electrode CE.

Thus, the second insulating layer IL2 electrically insulates the input electrode IE, the output electrode OE, and the control electrode CE from each other.

An initial interlayer insulating layer IHA according to the present invention may be formed on the second insulating layer IL2. In the plan view, the initial interlayer insulating layer IHA may overlap a portion of a hole area PA. Thus, the initial interlayer insulating layer IHA may be formed to extend from a display area DA to a portion of the hole area PA. Thus, a portion of the initial interlayer insulating layer IHA that overlaps the hole area PA may be removed by an ashing process. The ashing process according to the present invention may use a plasma ashing process.

Figure 11B:
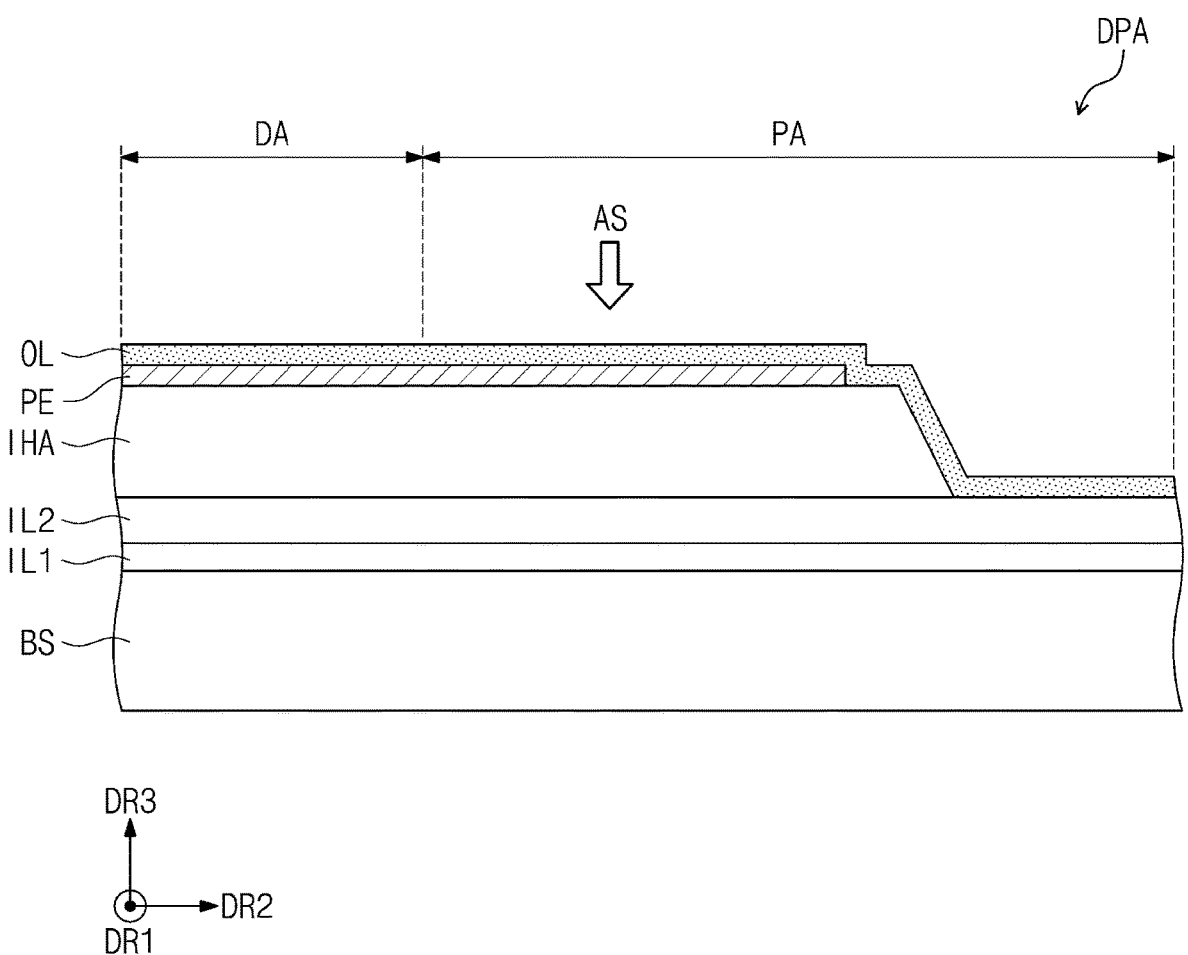

Thereafter, as illustrated in FIG. 11b, a pattern electrode PE may be formed on the base substrate BS. A charge control layer OL may be applied on the pattern electrode PE. The pattern electrode PE and the charge control layer OL according to the present embodiment may include the same material constituting the thin film transistor TR illustrated in FIG. 4a.

The pattern electrode PE may be formed during a process of depositing a first electrode E1 on the interlayer insulating layer IH of FIG. 4a. The charge control layer OL may be formed by depositing an organic material. That is, the pattern electrode PE and the charge control layer OL may be formed by being deposited on the display area DA and the hole area PA. The charge control layer OL may be deposited on at least a portion of a top surface IL2-T of the second insulating layer IL2 to form an additional pattern part OL-P.

In this embodiment, the additional pattern part OL-P including the same material as the charge control layer OL has been described, but the present invention is not limited thereto. For example, the material is not limited thereto if a material is capable of being provided for the deposition of the organic light emitting element ED. The deposition of the organic material has anisotropy. Thus, a portion of the organic material may be deposited in an inner space to form a pattern. The pattern may have a shape disconnected from a control layer. However, this is merely an example. For example, the pattern may be omitted depending on a time and speed of the deposition process.

Figure 11C:
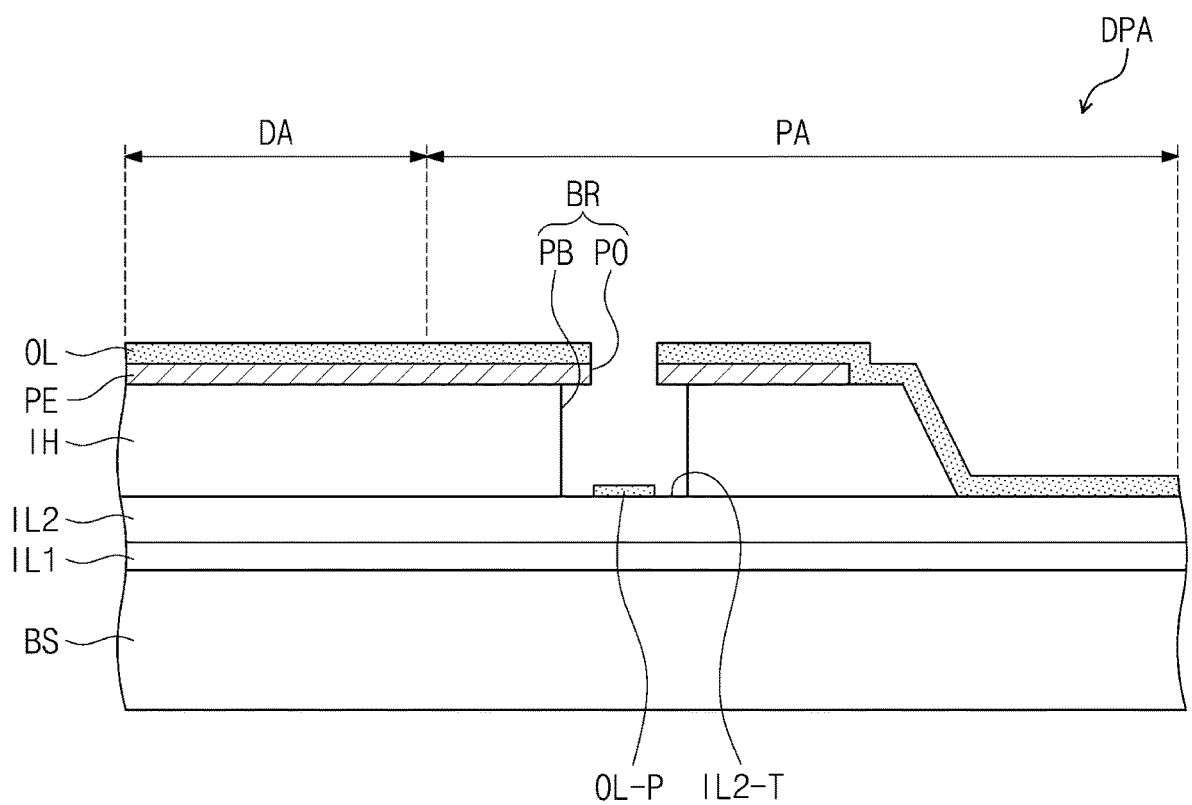

Thereafter, as illustrated in FIG. 11c, a preliminary panel DPA in which at least one blocking groove BR is formed is provided.

The blocking groove BR may have a shape in which the charge control layer OL, the pattern electrode PE, and the interlayer insulating layer IH are under-cut. The blocking groove BR overlaps the hole area PA. The blocking groove BR may be formed by an etching or laser process. For example, when using the etching process, an under-cut shape may be formed due to a difference in etching rate. For example, when using the laser process, an under-cut shape may be formed due to a difference in reactivity with respect to a laser wavelength. However, this is merely an example and is not limited to any one as long as it is a method for removing the inorganic and/or organic materials.

Figure 11D:
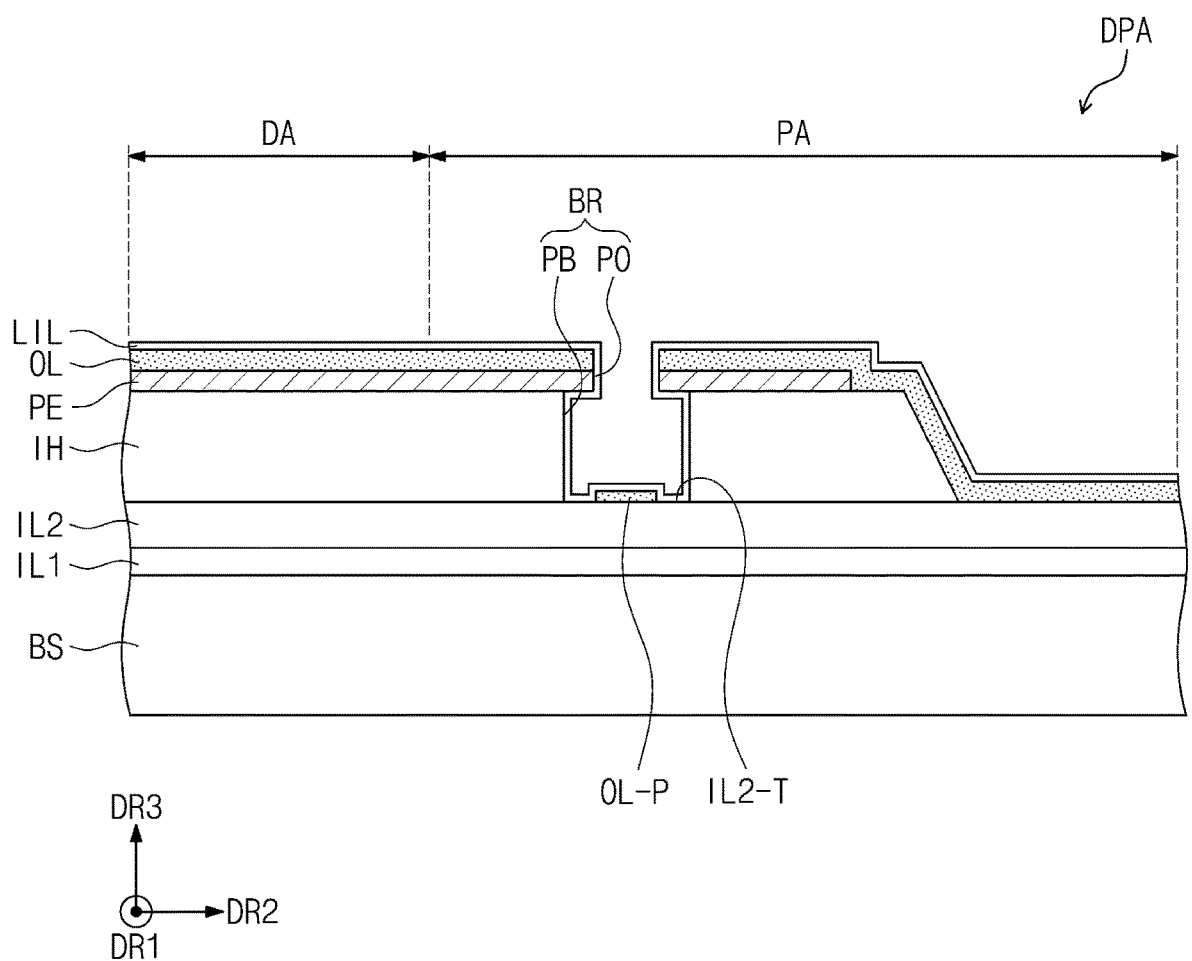

Thereafter, as illustrated in FIG. 11d, a first inorganic layer LIL is formed. The first inorganic layer LIL may be formed on the entire base substrate BS through chemical vapor deposition. The deposition of the inorganic layer has isotropic properties. Thus, the inside of the blocking groove BR may be surrounded by the first inorganic layer LIL. Thus, the first inorganic layer LIL overlapping the blocking groove BR may directly contact the blocking groove BR. The first inorganic layer LIL may be stably formed by contacting the under-cut portions.

Figure 11E:
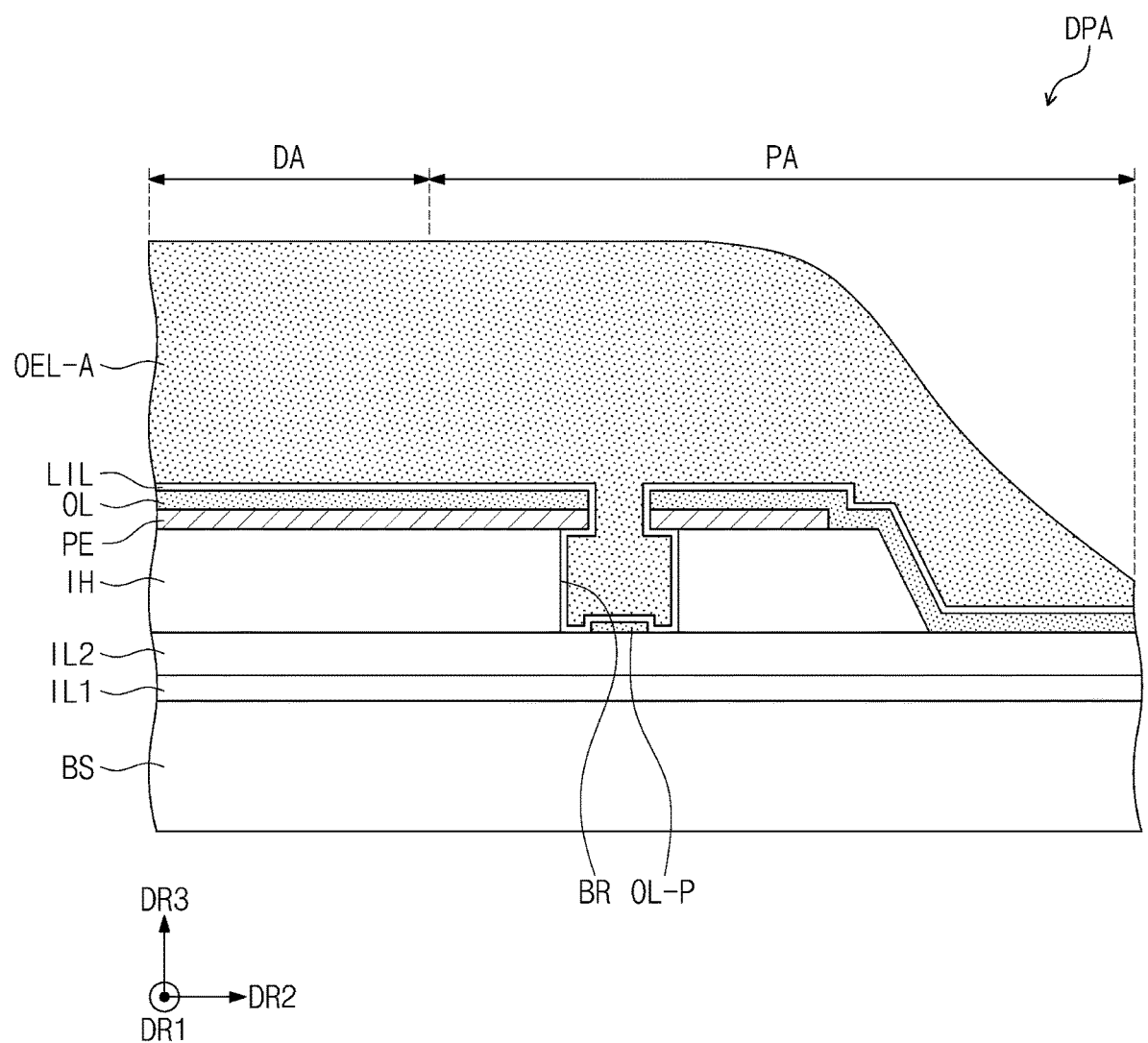

Thereafter, as illustrated in FIG. 11e, a preliminary organic layer OEL-A may be formed by applying an organic material to cover an entire surface of the first inorganic layer LIL. The preliminary organic layer OEL-A may be formed through an inkjet process. Thus, the organic material may be provided in a liquid form and may be applied by filling the blocking groove BR based on a viscosity of the organic material.

Figure 11F:
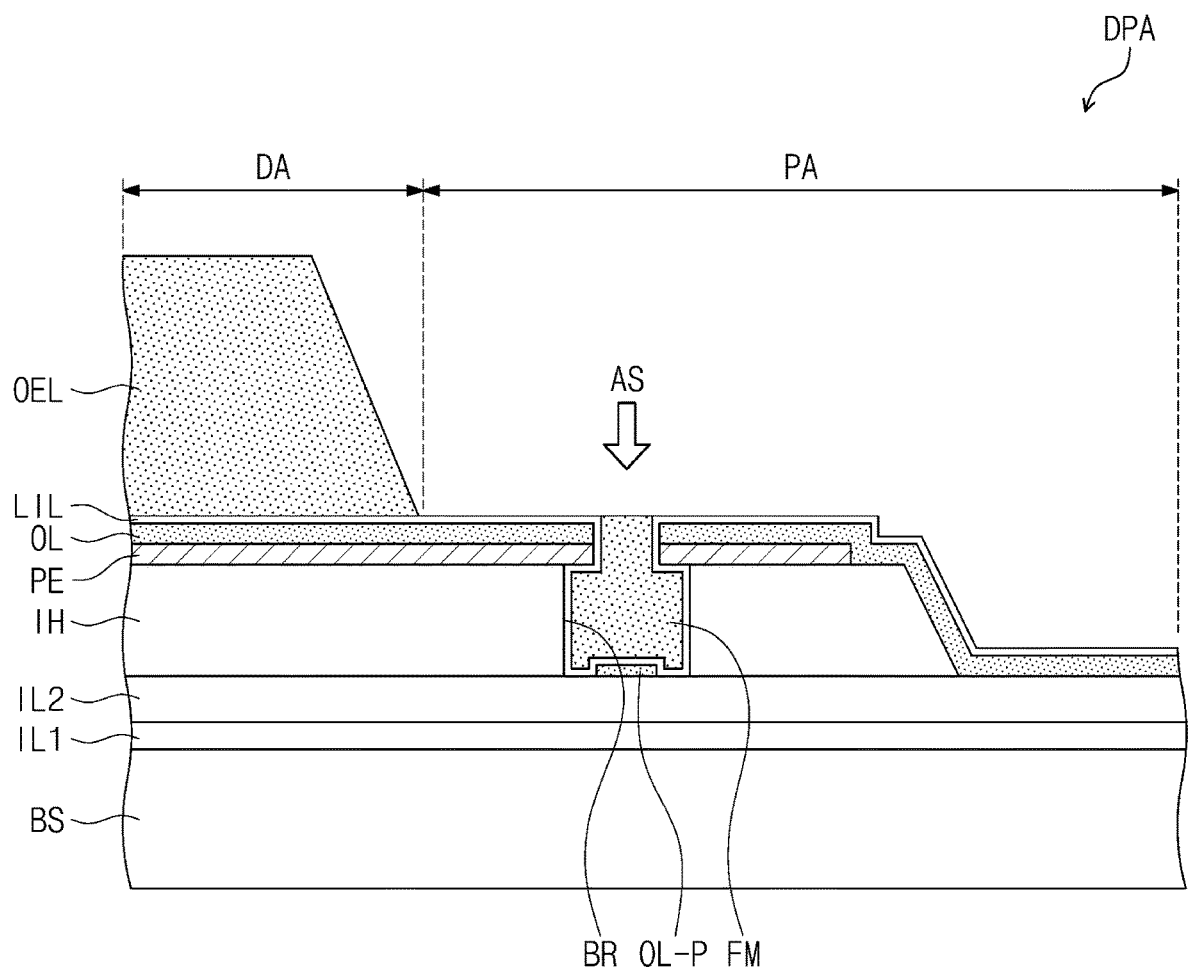

Thereafter, as illustrated in FIG. 11f, a portion of the preliminary organic layer OEL-A may be removed to form an organic layer OEL and a filling member FM. A portion of the preliminary organic layer OEL-A may be removed by an ashing process. The ashing process according to the present invention may use a plasma ashing process. The portions other than the organic layer OEL and the filling member FM are removed by the ashing process.

Thus, a portion of the preliminary organic layer OEL-A, which exists in the hole area PA except for a portion filled in the blocking groove BR may be removed. Thus, the preliminary organic layer OEL-A does not remain on the first inorganic layer LIL adjacent to the blocking groove BR in the hole area PA. After the ashing process, the preliminary organic layer OEL-A corresponding to the display area DA may be formed as an organic layer OEL, which is one component of an encapsulation layer TFE.

Figure 11G:
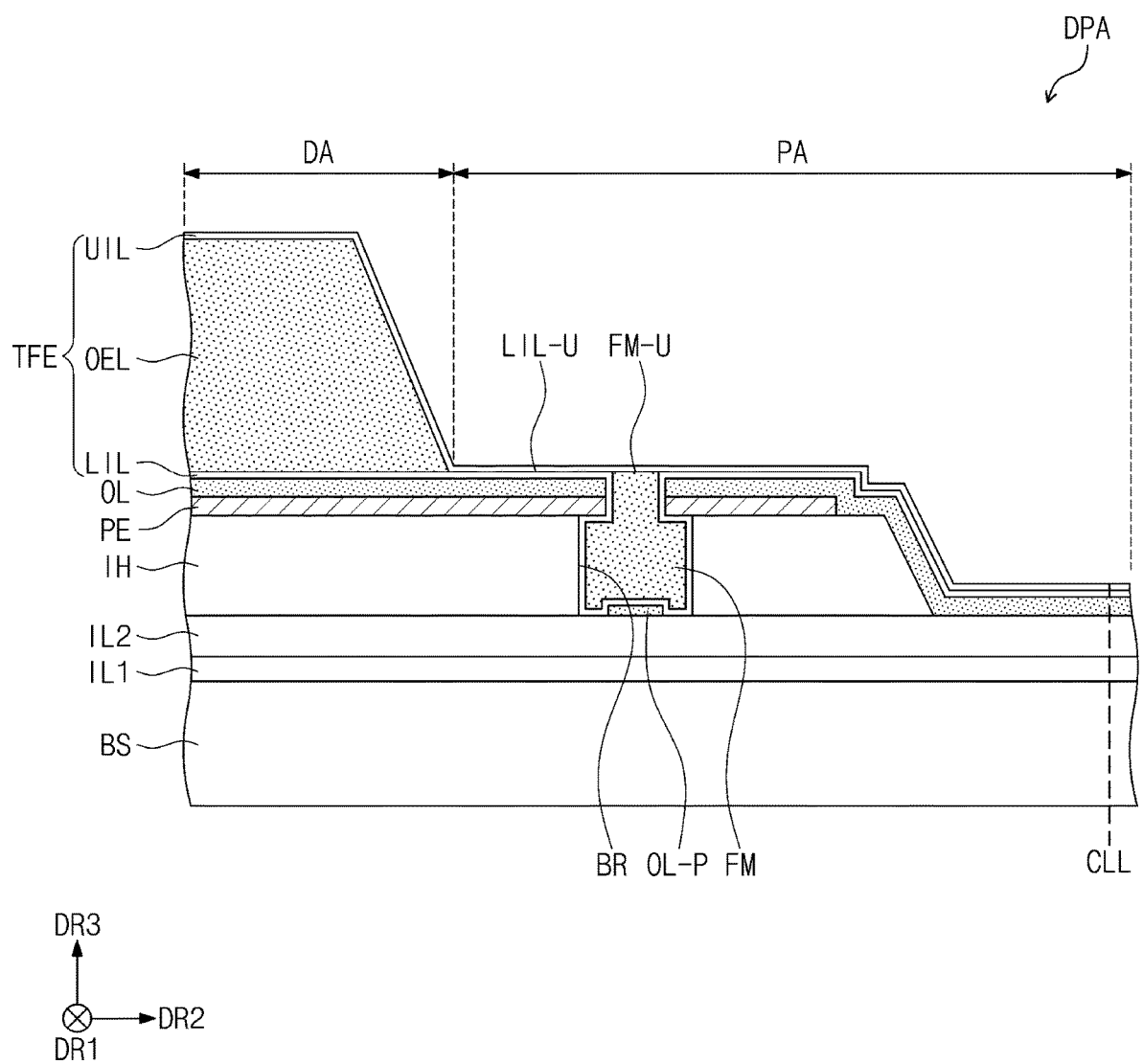
Figure 11H:
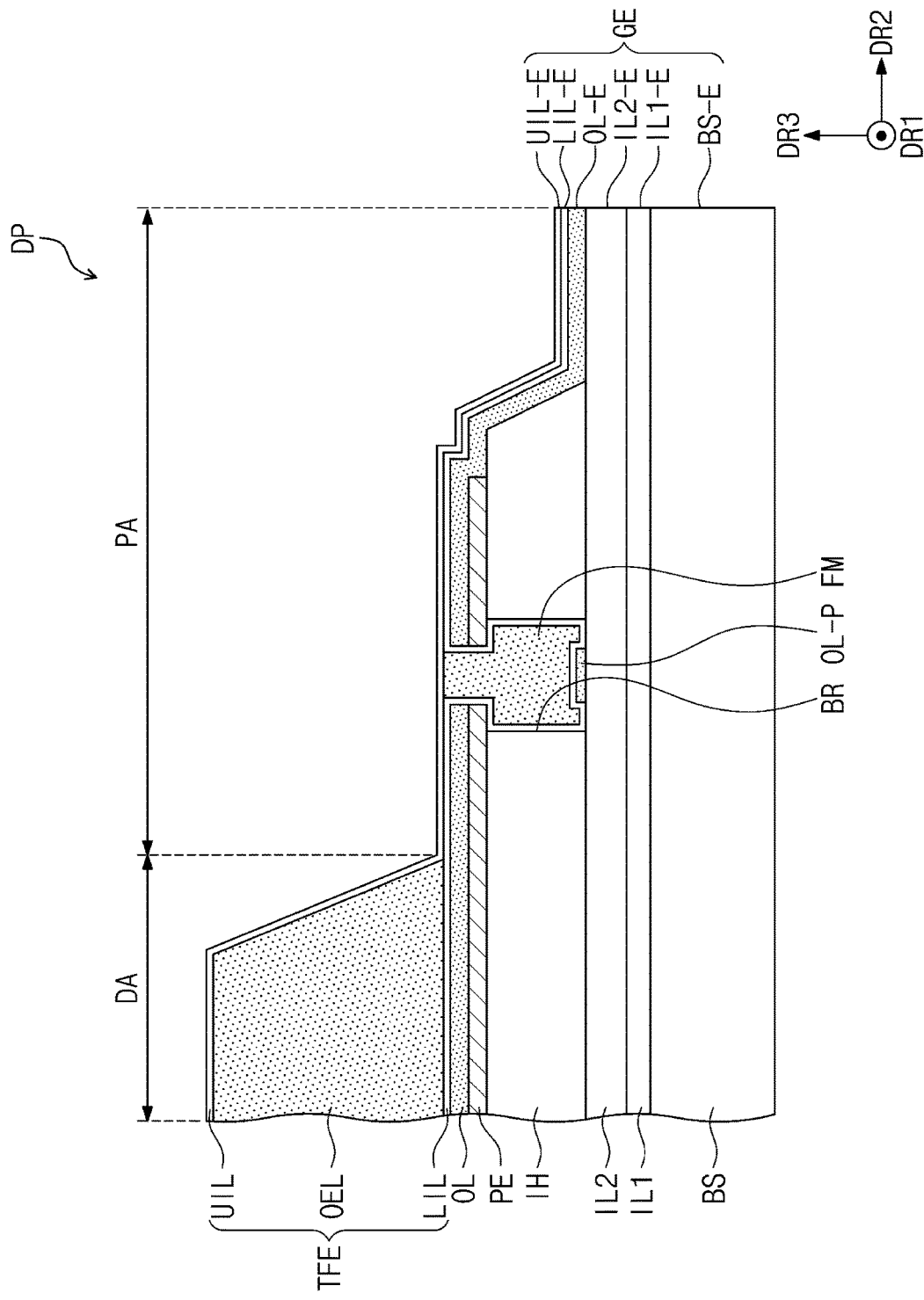

Thereafter, as illustrated in FIG. 11g, a second inorganic layer UIL including an inorganic material may be deposited on the base substrate BS. The second inorganic layer UIL may be formed on the entire surface of the base substrate BS through chemical vapor deposition. The second inorganic layer UIL may be applied to the entire surface of the base substrate BS to cover the organic layer OEL and the filling member FM. The second inorganic layer UIL may contact a top surface FM-U of the filling member FM.

As described above, as the preliminary organic layer OEL-A adjacent to the blocking groove BR is removed through the ashing process, the second inorganic layer UIL may be formed to contact a top surface LIL-U of the first inorganic layer LIL adjacent to the blocking groove BR. Thus, a moving path of oxygen light and moisture in a region adjacent to the blocking groove BR may be easily blocked.

Thereafter, referring to FIG. 9f, a module hole MH may be formed in an area of the display area DA, which overlaps the hole area PA. The module hole MH may be formed by the same process as one of the processes of forming a pixel layer PL (see FIG. 4a). The module hole MH may be formed as an inner surface GE formed by aligning each of an end BS-E of a base substrate, an end IL1-E of a first insulating layer, an end IL2-E of a second insulating layer, an end OL-E of a charge control layer, an end LIL-E of a first encapsulation inorganic layer, and an end UIL-E of a second encapsulation inorganic layer.

In the method of manufacturing the display panel according to an embodiment of the present invention, the organic layer OEL forming an encapsulation layer TFE and a charging member FM supporting the inside of the blocking groove BR may be formed at the same time to improve process efficiency. In addition, the inside of the blocking groove BR, which has an under-cut shape and thus has relatively low strength, may be supported to provide the display panel having improved impact strength. Also, the first inorganic layer LIL and the second inorganic layer UIL, which are adjacent to the module hole MH, may contact each other to more effectively block moisture and oxygen, which are introduced form the outside.

It will be apparent to those skilled in the art that various modifications and deviations can be made in the present invention. Thus, it is intended that the present disclosure covers the modifications and deviations of this invention provided they come within the scope of the appended claims and their equivalents.

Accordingly, the technical scope of the present invention should not be limited to the contents described in the detailed description of the specification, but should be determined by the claims.

According to the present invention, the display panel that does not interfere with the electronic module may be provided. Therefore, even though the electronic module is provided, the display device having the narrow bezel area may be provided, which have high industrial applicability.

The invention claimed is:

1. A display panel comprising:
a base substrate that is divided into a display area and a peripheral area adjacent to the display area in a plan view;
a thin element layer comprising:
a thin film transistor disposed on the base substrate;
an interlayer insulating layer covering the thin film transistor; and
a lower insulating layer disposed between the interlayer insulating layer and the base substrate;
an organic light emitting element disposed on the display area and connected to the thin film transistor;
an encapsulation layer disposed on the thin element layer and comprising a first inorganic layer, a second inorganic layer disposed on the first inorganic layer, and an organic layer disposed between the first inorganic layer and the second inorganic layer;
a module hole defined in the display area and penetrating from a rear surface of the base substrate to a top surface of the encapsulation layer;
a first blocking groove defined in the display area adjacent to the module hole and penetrating through the interlayer insulating layer to expose a portion of a top surface of the lower insulating layer; and
a pattern electrode extending over the first blocking groove.

2. The display panel of claim 1, wherein the thin film transistor comprises a semiconductor pattern disposed on the base substrate, a control electrode spaced apart from the semiconductor pattern and overlapping the semiconductor pattern in the plan view, and input and output electrodes which are spaced apart from each other and each of which is connected to the semiconductor pattern,
wherein the lower insulating layer comprises a first insulating layer disposed between the control electrode and the semiconductor pattern and a second insulating layer configured to the first insulating layer and the interlayer insulating layer, and
a top surface of the second insulating layer provides a top surface of the lower insulating layer.

3. The display panel of claim 1, wherein the first blocking groove has an under-cut shape, and
an inner surface of the first blocking groove is covered by the first inorganic layer.

4. The display panel of claim 3, further comprising a pixel layer having the pattern electrode disposed between the interlayer insulating layer and the first inorganic layer to at least partially overlap a penetrated portion of the interlayer insulating layer in the plan view,
wherein the pattern electrode contacts the first inorganic layer.

5. The display panel of claim 1, wherein the first blocking groove has a closed shape surrounding the module hole in the plan view.

6. The display panel of claim 1, further comprising a second blocking groove spaced apart from the first blocking groove so as to be defined between the first blocking groove and the organic light emitting element in the plan view, the second blocking groove being configured to pass through the interlayer insulating layer so as to expose a portion of a top surface of the lower insulating layer,
wherein an inner surface of the second blocking groove is covered by the first inorganic layer, and
the organic layer covers the first inorganic layer.

7. The display panel of claim 1, further comprising a third blocking groove spaced apart from the first blocking groove so as to be defined between the module hole and the first blocking groove in the plan view, the third blocking groove being configured to pass through the interlayer insulating layer so as to expose a portion of a top surface of the lower insulating layer,
wherein an inner surface of the third blocking groove is covered by the first inorganic layer, and
the second inorganic layer covers the first inorganic layer.

8. The display panel of claim 1, further comprising a filling member which is disposed inside the first blocking groove surrounded by the first inorganic layer and comprises an organic material.

9. The display panel of claim 8, wherein the second inorganic layer covers the filling member and the first inorganic layer.

10. The display panel of claim 1, wherein the base substrate comprises at least one of glass, plastic, or a metal.

11. An electronic apparatus comprising:
a base substrate that is divided into a display area and a peripheral area adjacent to the display area in a plan view;
an organic light emitting element disposed on the display area and comprising a first electrode, a second electrode disposed on the first electrode, and an emission layer disposed between the first electrode and the second electrode;
a thin element layer comprising:
a thin film transistor connected to the organic light emitting element;
an interlayer insulating layer on which the first electrode is disposed and which is disposed between the thin film transistor and the organic light emitting element;
a lower insulating layer disposed between the base substrate and the interlayer insulating layer; and
a pattern electrode disposed on the interlayer insulating layer;
an encapsulation layer disposed on the thin element layer and comprising:
a first inorganic layer;
a second inorganic layer disposed on the first inorganic layer; and
an organic layer disposed between the first inorganic layer and the second inorganic layer;
a module hole defined in the display area and penetrating from a rear surface of the base substrate to a top surface of the encapsulation layer;
a blocking groove disposed in the display area and defined by a pattern part adjacent to the module hole and an opening configured to overlap the exposed pattern part with a portion of the pattern electrode extending over the blocking groove; and an electronic module configured to overlap the module hole, wherein the pattern part passes through the interlayer insulating layer to expose a portion of a top surface of the lower insulating layer.

12. The electronic apparatus of claim 11, wherein the pattern electrode is disposed on the same layer as the first electrode and comprises the same material as the first electrode.

13. The electronic apparatus of claim 12, wherein the opening has a width less than a width of the pattern part in a cross-section.

14. The electronic apparatus of claim 11, wherein the pattern electrode is disposed to pass through the interlayer insulating layer so as to cover at least a portion of the pattern part, and the opening is defined to pass through the pattern electrode and has a planar area less than a planar area of the pattern part.

15. The electronic apparatus of claim 11, wherein an inner surface of the module hole is defined as:

an end of the penetrated base substrate; and an end of each of the lower insulating layer, the first inorganic layer, and the second inorganic layer, which are aligned with the end of the base substrate.

16. The electronic apparatus of claim 11, wherein the pattern electrode and a portion of the top surface of the lower insulating layer contact the first inorganic layer.

17. The electronic apparatus of claim 11, wherein the blocking groove has a closed shape surrounding the module hole in the plan view.

18. The electronic apparatus of claim 11, wherein the electronic module comprises at least one of an audio output module, a light emitting module, a light receiving module, or a camera module.

19. A method for manufacturing a display panel, the method comprising:

forming a thin element layer comprising a pixel comprising a plurality of insulating layers on a display area of a base substrate that is divided into the display area comprising a hole area and a peripheral area adjacent to the display area;

removing a portion of one of the insulating layers overlapping the hole area to form a blocking groove;

forming a pattern electrode to extend partially over the blocking groove;

depositing a first inorganic layer to the thin element layer and an inner surface of the blocking groove;

applying an organic material on the first inorganic layer to form a preliminary organic layer so as to fill the blocking groove and cover the thin element layer;

removing portions of the preliminary organic layer, which overlap the display area and a blocking area, to form an organic layer and a pattern part, respectively;

forming a second inorganic layer which covers the organic layer and a filling member; and passing through the base substrate to form a module hole in an area surrounded by the blocking groove.

20. The method of claim 19, wherein the thin element layer comprises a thin film transistor and an organic light emitting element connected to the thin film transistor, and the blocking groove is formed by removing a portion of the insulating layer disposed between the organic light emitting element and the thin film transistor.

* * * * *